United States Patent
Yu et al.

(10) Patent No.: US 11,902,009 B2
(45) Date of Patent: Feb. 13, 2024

(54) SATELLITE COMMUNICATION METHOD AND APPARATUS

(71) Applicant: HUAWEI TECHNOLOGIES CO., LTD., Shenzhen (CN)

(72) Inventors: Rongdao Yu, Shenzhen (CN); Jun Chen, Dongguan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 699 days.

(21) Appl. No.: 16/997,046

(22) Filed: Aug. 19, 2020

(65) Prior Publication Data

US 2020/0382204 A1     Dec. 3, 2020

Related U.S. Application Data

(63) Continuation of application No. PCT/CN2019/124159, filed on Dec. 10, 2019.

(30) Foreign Application Priority Data

Dec. 10, 2018 (CN) .......................... 201811505804.1

(51) Int. Cl.
  *H04B 7/185* (2006.01)
(52) U.S. Cl.
  CPC ................. *H04B 7/18513* (2013.01)
(58) Field of Classification Search
  CPC ............ H04B 7/18513; H03M 13/098; H03M 13/05; H03M 13/09; H03M 13/45;
  (Continued)

(56) References Cited

U.S. PATENT DOCUMENTS

2003/0026346 A1* 2/2003 Matsumoto ........... H04L 1/0066
                                                                 375/262
2010/0091629 A1   4/2010 Tan et al.
                          (Continued)

FOREIGN PATENT DOCUMENTS

CN        102223216 A    10/2011
CN        102412935 A     4/2012
                (Continued)

OTHER PUBLICATIONS

3GPP TS 36.212 V15.3.0 (Oct. 2018), 3rd Generation Partnership Project; Technical Specification Group Radio Access Network; Evolved Universal Terrestrial Radio Access (E-UTRA); Multiplexing and channel coding(Release 15), (ETSI TS 136 212) 247 pages.

*Primary Examiner* — Thien Nguyen
(74) *Attorney, Agent, or Firm* — Rimon PC

(57) ABSTRACT

This application provides encoding and decoding methods to reduce retransmission in satellite communication. A sending apparatus obtains an information transport block, where the information transport block includes a plurality of code blocks; and generates a redundant code block based on at least two of the plurality of code blocks. The at least two code blocks and the redundant code block are sent over a satellite channel after channel coding. A receiving apparatus receives the to-be-decoded information over the satellite channel, calculates, based on the to-be-decoded information of the at least two code blocks and the redundant code block, an a priori log-likelihood ratio of a to-be-decoded bit, and combines the a priori log-likelihood ratio and a log-likelihood ratio obtained after demodulation, to obtain a diversity gain. Decoding is performed based on the combined log-likelihood ratio. This method improves decoding accuracy and reduces the need for retransmission.

7 Claims, 9 Drawing Sheets

(58) Field of Classification Search
CPC . H04L 1/0061; H04L 1/00; H04L 1/22; H04L 1/0054; H04L 1/0064; H04L 1/0059
See application file for complete search history.

(56) References Cited

U.S. PATENT DOCUMENTS

| | | |
|---|---|---|
| 2010/0287439 A1 | 11/2010 | Papagiannis |
| 2012/0159282 A1* | 6/2012 | Ito ..................... H03M 13/098 |
| | | 714/752 |
| 2018/0287744 A1 | 10/2018 | Sundararajan et al. |
| 2022/0069941 A1* | 3/2022 | Levitsky ............... H04L 1/1835 |

FOREIGN PATENT DOCUMENTS

| | | |
|---|---|---|
| CN | 102484484 A | 5/2012 |
| CN | 107179961 A | 9/2017 |
| CN | 108809517 A | 11/2018 |
| EP | 2472726 A1 | 7/2012 |
| WO | 2018053854 A1 | 3/2018 |

* cited by examiner

SATELLITE COMMUNICATION METHOD AND APPARATUS

CROSS-REFERENCE TO RELATED APPLICATIONS

This application is a continuation of International Application No. PCT/CN2019/124159, filed on Dec. 10, 2019, which claims priority to Chinese Patent Application No. 201811505804.1, filed on Dec. 10, 2018. The disclosures of the aforementioned applications are hereby incorporated by reference in their entireties.

TECHNICAL FIELD

This application relates to the communications field, and more specifically, to a satellite communication method and related apparatus.

BACKGROUND

Future 5G networks and evolved 5G networks need to meet service requirements of various industries and need to provide wider service coverage. Limited coverage capabilities of current terrestrial mobile communications networks cannot meet users' demand for obtaining information anytime anywhere. In scenarios such as remote areas, deserts, oceans, and the sky, providing wide coverage based on a coverage mode of a conventional terrestrial base station faces great challenges in terms of economics and feasibility. Meanwhile, satellite communication is advantageous over a conventional mobile communications system in that satellite communication has features such as long communication distance, large coverage area, and flexible networking, and can overcome natural geographical obstacles such as an ocean, a desert, or a high mountain, and communication costs are independent of a transmission distance. When it comes to overcoming the shortcomings of conventional communications networks, satellite communication may be an effective supplement to conventional networks.

A satellite base station is a base station that uses a man-made earth satellite, a high-altitude aircraft, or the like for wireless communication, for example, an evolved NodeB (eNB) and a 5G base station (gNB). A satellite base station may be a geostationary earth orbit (GEO) satellite, or may be a medium earth orbit (MEO) satellite and a low earth orbit (LEO) satellite in a non-geostationary earth orbit (NGEO), or may be a high altitude platform station (HAPS), or the like. However, regardless of the type of satellites, the distance from a satellite base station to a terminal device is still much longer than the distance from a terrestrial base station to a terminal device, and there significant limitations if a technology of a terrestrial communication cellular network is applied directly.

Currently, a terrestrial communication cellular network resolves the bit error problem by using a hybrid automatic repeat request (HARQ) technology. A sending apparatus performs channel coding on the to-be-transmitted data and then sends the to-be-transmitted data to a receiving apparatus. The receiving apparatus corrects correctable errors using a forward error correction (FEC) technology, identifies a data packet with an uncorrectable error through error detection, discards the data packet with the uncorrectable error, and requests the sending apparatus to resend the same data packet. A principle diagram is shown in FIG. 1. A sending apparatus sends a data packet 1. A receiving apparatus receives and decodes the data packet 1, determines that decoding is correct, and feeds back an ACK to the sending apparatus. After receiving the ACK, the sending apparatus knows that the receiving apparatus has correctly received the data packet 1. The sending apparatus sends a new data packet 2. The receiving apparatus receives and decodes the data packet 2, determines that decoding is incorrect, and feeds back a NACK to the sending apparatus. After receiving the NACK sent by the receiving apparatus, the sending apparatus knows that the receiving apparatus has not correctly received the data packet 2, and retransmits the data packet 2. The HARQ improves decoding accuracy by using FEC error correction and retransmission. However, in HARQ, there is a transmission delay during retransmission, which is acceptable in a terrestrial communications cellular network. However, when HARQ is applied to satellite communication, such transmission delay cannot be ignored. Transmission delay caused by high altitude and long distance severely affects communication quality. How to ensure decoding accuracy and avoid delay caused by retransmission is one of the problems that urgently need to be solved in the satellite communications field.

SUMMARY

This application provides an information transmission method and an apparatus applied to satellite communication, to reduce a retransmission probability and improve data transmission reliability in satellite communication.

According to a first aspect, a satellite communication method is provided. The method includes:

obtaining, by a sending apparatus, an information transport block, where the information transport block includes K code blocks, and K is a positive integer greater than or equal to 2; generating, by the sending apparatus, a redundant code block based on at least two of the K code blocks, where lengths of the at least two code blocks are equal; separately performing, by the sending apparatus, channel coding on the at least two code blocks and the redundant code block; and sending, by the sending apparatus over a satellite channel, the at least two code blocks and the redundant code block on which channel coding has been performed.

In a first possible implementation of the first aspect, the generating, by the sending apparatus, a redundant code block based on at least two of the K code blocks includes:

generating, by the sending apparatus, the redundant code block based on the at least two of the K code blocks in a redundant code block generation manner.

With reference to the first aspect or the first possible implementation of the first aspect, in a second possible implementation of the first aspect, the redundant code block generation manner is an exclusive OR operation, a $j^{th}$ bit of the redundant code block is obtained by performing the exclusive OR operation on a $j^{th}$ bit of each of the at least two code blocks, j is an integer greater than 0 and less than or equal to L, and L is a length of each of the at least two code blocks. The redundant code block is generated through the exclusive OR operation, which makes implementation simple.

With reference to the first aspect or all the foregoing possible implementations of the first aspect, in a third possible implementation of the first aspect, lengths of the K code blocks are all equal, and K is a positive integer. The information transport block is divided into code blocks of an equal length, so that implementation is simpler.

With reference to the first aspect or all the foregoing possible implementations of the first aspect, in a fourth possible implementation of the first aspect, the information transport block includes C groups of code blocks, each group includes at least two code blocks, and lengths of the code blocks in the group are equal. The total number of code blocks in the C groups of code blocks is K, C is a positive integer greater than or equal to 2, the at least two of the K code blocks are at least two code blocks in one of the C groups of code blocks, and C is a positive integer greater than or equal to 2. In this implementation, the information transport block is divided into a plurality of groups, and the redundant code block may be generated on a per-group basis, so that a processing manner is more flexible.

With reference to the first aspect or all the foregoing possible implementations of the first aspect, in a fifth possible implementation of the first aspect, the method further includes: concatenating, by the sending apparatus, the at least two code blocks and the redundant code block on which channel coding has been performed, to obtain concatenated code blocks; and the sending, by the sending apparatus, the at least two code blocks and the redundant code block on which channel coding has been performed includes: sending, by the sending apparatus, the concatenated code blocks.

With reference to the first aspect or all the foregoing possible implementations of the first aspect, in a sixth possible implementation of the first aspect, the sending apparatus is a terminal device or a satellite base station.

According to a second aspect, a satellite communication method is provided. The method includes:

obtaining, by a receiving apparatus, to-be-decoded information, where the to-be-decoded information includes log-likelihood ratios obtained after demodulation of at least two of K code blocks of an information transport block and a redundant code block, and the redundant code block is generated based on the at least two of the K code blocks; determining, by the receiving apparatus, an a priori log-likelihood ratio of each to-be-decoded bit based on a log-likelihood ratio obtained after demodulation of the to-be-decoded bit and the log-likelihood ratio obtained after demodulation of the redundant code block; determining, by the receiving apparatus, a combined log-likelihood ratio of each to-be-decoded bit of the at least two of the K code blocks, where the combined log-likelihood ratio is obtained by adding the a priori log-likelihood ratio of each to-be-decoded bit and the log-likelihood ratio obtained after demodulation of the to-be-decoded bit; and obtaining, by the receiving apparatus, a decoding result of the at least two code blocks based on the combined log-likelihood ratio corresponding to each to-be-decoded bit of the at least two code blocks.

In a first possible implementation of the second aspect, the determining, by the receiving apparatus, an a priori log-likelihood ratio of each to-be-decoded bit based on a log-likelihood ratio obtained after demodulation of the to-be-decoded bit and the log-likelihood ratio obtained after demodulation of the redundant code block includes:

determining, based on the log-likelihood ratio obtained after demodulation of each to-be-decoded bit and the log-likelihood ratio obtained after demodulation of the redundant code block, a priori probability information about each to-be-decoded bit being decoded as 0 or 1; and determining the a priori log-likelihood ratio of each to-be-decoded bit based on the a priori probability information about each to-be-decoded bit being decoded as 0 or 1.

With reference to the second aspect or the first possible implementation of the second aspect, in a second possible implementation of the second aspect, the determining, by the receiving apparatus, an a priori log-likelihood ratio of each to-be-decoded bit based on a log-likelihood ratio obtained after demodulation of the to-be-decoded bit and the log-likelihood ratio obtained after demodulation of the redundant code block specifically includes:

determining the a priori log-likelihood ratio of each to-be-decoded bit based on the following formula:

$$LLR_{m_{ij}}^{aprior} = \ln\left(\frac{Pr_{ch}^{aprior}(m_{ij}=0)}{Pr_{ch}^{aprior}(m_{ij}=1)}\right),$$

where $LLR_{m_{ij}}^{aprior}$ is an a priori log-likelihood ratio of a $j^{th}$ bit of an $i^{th}$ code block of the K code blocks, $m_{ij}$ is the $j^{th}$ bit of the $i^{th}$ code block of the K code blocks, $Pr_{ch}^{aprior}(m_{ij}=0)$ is a priori probability information about the $j^{th}$ bit of the $i^{th}$ code block of the K code blocks being 0, $Pr_{ch}^{aprior}(m_{ij}=1)$ is a priori probability information about the $j^{th}$ bit of the $i^{th}$ code block of the K code blocks being 1, i is a positive integer less than or equal to K, and j is an integer greater than or equal to 0.

With reference to the second aspect or all the foregoing possible implementations of the second aspect, in a third possible implementation of the second aspect, the information transport block includes C groups of code blocks, each group includes at least two code blocks, and lengths of the code blocks in the group are equal. The total number of code blocks in the C groups of code blocks is K, the at least two of the K code blocks are at least two code blocks in one of the C groups of code blocks, and C is a positive integer greater than or equal to 2.

With reference to the second aspect or all the foregoing possible implementations of the second aspect, in a fourth possible implementation of the second aspect, the receiving apparatus combines the C groups of decoded code blocks based on a code block grouping sequence, to obtain the information transport block sent by a sending apparatus.

With reference to the second aspect or all the foregoing possible implementations of the second aspect, in a fifth possible implementation of the second aspect, the method further includes:

de-concatenating, by the receiving apparatus, the at least two code blocks and the redundant code block sent by the sending apparatus.

With reference to the second aspect or all the foregoing possible implementations of the second aspect, in a sixth possible implementation of the second aspect, the receiving apparatus is a terminal device or a satellite base station.

According to a third aspect, a satellite communication method is provided. The method includes:

obtaining, by a receiving apparatus, to-be-decoded information, where the to-be-decoded information includes log-likelihood ratios obtained after demodulation of at least two of K code blocks of an information transport block and a redundant code block, and the redundant code block is generated based on at least two of the K code blocks; performing, by the receiving apparatus, decoding based on a log-likelihood ratio obtained after demodulation of each to-be-decoded bit of the at least two code blocks; determining, by the receiving apparatus, that at least one code block has a decoding error, and determining, by the receiving apparatus based on a log-likelihood ratio obtained after demodulation of each to-be-decoded bit of the code block having the decoding error and the log-likelihood ratio obtained after demodulation of the redundant code block, an a priori log-likelihood ratio of each to-be-decoded bit of the code block having the decoding error; determining, by the receiving apparatus, a combined log-likelihood ratio corresponding to each to-be-decoded bit of the code block having the decoding error, where the combined log-likelihood ratio is obtained by adding the a priori log-likelihood ratio of each to-be-decoded bit of the code block having the decoding error and a log-likelihood ratio obtained after demodulation of the bit; and obtaining, by the receiving apparatus based on the combined log-likelihood ratio of each to-be-decoded bit of the code block having the decoding error, a decoding result of the code block having the decoding error. Compared with the method according to the second aspect, this method reduces a quantity of times of generating the redundant code block and reduces a calculation amount.

In a first possible implementation of the third aspect, the determining, by the receiving apparatus, that at least one code block has a decoding error, and determining, by the receiving apparatus based on a log-likelihood ratio obtained after demodulation of each to-be-decoded bit of the code block having the decoding error and the log-likelihood ratio obtained after demodulation of the redundant code block, an a priori log-likelihood ratio of each to-be-decoded bit of the code block having the decoding error includes:

determining, based on the log-likelihood ratio obtained after demodulation of each to-be-decoded bit and the log-likelihood ratio obtained after demodulation of the redundant code block, a priori probability information about each to-be-decoded bit being decoded as 0 or 1; and determining the a priori log-likelihood ratio of each to-be-decoded bit based on the a priori probability information about each to-be-decoded bit being decoded as 0 or 1.

With reference to the third aspect or the first possible implementation of the third aspect, in a second possible implementation of the third aspect, the determining, by the receiving apparatus, that at least one code block has a decoding error, and determining, by the receiving apparatus based on a log-likelihood ratio obtained after demodulation of each to-be-decoded bit of the code block having the decoding error and the log-likelihood ratio obtained after demodulation of the redundant code block, an a priori log-likelihood ratio of each to-be-decoded bit of the code block having the decoding error specifically includes:

determining the a priori log-likelihood ratio of each to-be-decoded bit based on the following formula:

$$LLR_{m_{ij}}^{aprior} = \ln\left(\frac{Pr_{ch}^{aprior}(m_{ij}=0)}{Pr_{ch}^{aprior}(m_{ij}=1)}\right),$$

where $LLR_{m_{ij}}^{aprior}$ is an a priori log-likelihood ratio of a $j^{th}$ bit of an $i^{th}$ code block of the K code blocks, $m_{ij}$ is the $j^{th}$ bit of the $i^{th}$ code block of the K code blocks, $Pr_{ch}^{aprior}(m_{ij}=0)$ is a priori probability information about the $j^{th}$ bit of the $i^{th}$ code block of the K code blocks being 0, $Pr_{ch}^{aprior}(m_{ij}=1)$ is a priori probability information about the $j^{th}$ bit of the $i^{th}$ code block of the K code blocks being 1, i is a positive integer less than or equal to K, and j is an integer greater than or equal to 0.

With reference to the third aspect or all the foregoing possible implementations of the third aspect, in a third possible implementation of the third aspect, the determining, by the receiving apparatus, that at least one code block has a decoding error includes:

determining, by the receiving apparatus based on a cyclic redundancy check, that at least one code block has the decoding error.

With reference to the third aspect or all the foregoing possible implementations of the third aspect, in a fourth possible implementation of the third aspect, the information transport block includes C groups of code blocks, each group includes at least two code blocks, and lengths of the code blocks in the group are equal. The total number of code blocks in the C groups of code blocks is K, the at least two of the K code blocks are at least two code blocks in one of the C groups of code blocks, and C is a positive integer greater than or equal to 2.

With reference to the third aspect or all the foregoing possible implementations of the third aspect, in a fifth possible implementation of the third aspect, the receiving apparatus combines the C groups of decoded code blocks based on a code block grouping sequence, to obtain the information transport block sent by a sending apparatus.

With reference to the third aspect or all the foregoing possible implementations of the third aspect, in a sixth possible implementation of the third aspect, the method further includes:

de-concatenating, by the receiving apparatus, the at least two code blocks and the redundant code block sent by the sending apparatus.

With reference to the third aspect or all the foregoing possible implementations of the third aspect, in a seventh possible implementation of the third aspect, the receiving apparatus is a terminal device or a satellite base station.

According to a fourth aspect, a sending apparatus is provided. The sending apparatus includes:

an obtaining module, configured to obtain an information transport block, where the information transport block includes K code blocks, and K is a positive integer greater than or equal to 2; a generation module, configured to generate a redundant code block based on at least two of the K code blocks, where lengths of the at least two code blocks are equal; a channel coding module, configured to separately perform channel coding on the at least two code blocks and the redundant code block; and a sending module, configured to send the at least two code blocks and the redundant code block on which channel coding has been performed.

In a first possible implementation of the fourth aspect, the generation module is configured to generate, by the sending apparatus, the redundant code block based on the at least two of the K code blocks in a redundant code block generation manner.

With reference to the fourth aspect or the first possible implementation of the fourth aspect, in a second possible implementation of the fourth aspect, the redundant code block generation manner is an exclusive OR operation, a $j^{th}$ bit of the redundant code block is obtained by performing the exclusive OR operation on a $j^{th}$ bit of each of the at least two code blocks, j is an integer greater than 0 and less than or equal to L, and L is a length of each of the at least two code blocks.

With reference to the fourth aspect or all the foregoing possible implementations of the fourth aspect, in a third possible implementation of the fourth aspect, the information transport block includes C groups of code blocks, each group includes at least two code blocks, lengths of the code blocks in the group are equal, the total number of code blocks in the C groups of code blocks is N, and C is a positive integer greater than or equal to 2.

With reference to the third aspect or all the foregoing possible implementations of the third aspect, in a fourth possible implementation of the third aspect, lengths of the K code blocks are all equal, and K is a positive integer.

With reference to the fourth aspect or all the foregoing possible implementations of the fourth aspect, in a fifth possible implementation of the fourth aspect, the information transport block includes C groups of code blocks, each group includes at least two code blocks, and lengths of the code blocks in the group are equal. The total number of code blocks in the C groups of code blocks is K, C is a positive integer greater than or equal to 2, the at least two of the K code blocks are at least two code blocks in one of the C groups of code blocks, and C is a positive integer greater than or equal to 2.

With reference to the fourth aspect or all the foregoing possible implementations of the fourth aspect, in a sixth possible implementation of the fourth aspect, the sending apparatus further includes: a concatenation module, configured to concatenate the at least two code blocks and the redundant code block on which channel coding has been performed, to obtain concatenated code blocks; and the sending, by the sending apparatus, the at least two code blocks and the redundant code block on which channel coding has been performed includes: sending, by the sending apparatus, the concatenated code blocks.

With reference to the fourth aspect or all the foregoing possible implementations of the fourth aspect, in a sixth possible implementation of the fourth aspect, the sending apparatus is a terminal device or a satellite base station.

According to a fifth aspect, a receiving apparatus is provided. The receiving apparatus includes:

an obtaining module, configured to obtain to-be-decoded information, where the to-be-decoded information includes log-likelihood ratios obtained after demodulation of at least two of K code blocks of an information transport block and a redundant code block, and the redundant code block is generated based on the at least two of the K code blocks; a first determining module, configured to determine an a priori log-likelihood ratio of each to-be-decoded bit based on a log-likelihood ratio obtained after demodulation of the to-be-decoded bit and the log-likelihood ratio obtained after demodulation of the redundant code block; a second determining module, configured to determine a combined log-likelihood ratio of each to-be-decoded bit of the at least two of the K code blocks, where the combined log-likelihood ratio is obtained by adding the a priori log-likelihood ratio of each to-be-decoded bit and the log-likelihood ratio obtained after demodulation of the to-be-decoded bit; and a decoding module, configured to obtain a decoding result of the at least two code blocks based on the combined log-likelihood ratio corresponding to each to-be-decoded bit of the at least two code blocks.

In a first possible implementation of the fifth aspect, the first determining module is further configured to: determine, based on the log-likelihood ratio obtained after demodulation of each to-be-decoded bit and the log-likelihood ratio obtained after demodulation of the redundant code block, a priori probability information about each to-be-decoded bit being decoded as 0 or 1; and determine the a priori log-likelihood ratio of each to-be-decoded bit based on the a priori probability information about each to-be-decoded bit being decoded as 0 or 1.

With reference to the fifth aspect or the first possible implementation of the fifth aspect, in a second possible implementation of the fifth aspect, the first determining module is further configured to determine the a priori log-likelihood ratio of each to-be-decoded bit based on the following formula:

$$LLR_{m_{ij}}^{aprior} = \ln\left(\frac{Pr_{ch}^{aprior}(m_{ij} = 0)}{Pr_{ch}^{aprior}(m_{ij} = 1)}\right),$$

where $LLR_{m_{ij}}^{aprior}$ is an a priori log-likelihood ratio of a $j^{th}$ bit of an $i^{th}$ code block of the K code blocks, $m_{ij}$ is the $j^{th}$ bit of the $i^{th}$ code block of the K code blocks, $Pr_{ch}^{aprior}(m_{ij}=0)$ is a priori probability information about the $j^{th}$ bit of the $i^{th}$ code block of the K code blocks being 0, $Pr_{ch}^{aprior}(m_{ij}=1)$ is a priori probability information about the $j^{th}$ bit of the $i^{th}$ code block of the K code blocks being 1, i is a positive integer less than or equal to K, and j is an integer greater than or equal to 0.

With reference to the fifth aspect or all the foregoing possible implementations of the fifth aspect, in a third possible implementation of the fifth aspect, the information transport block includes C groups of code blocks, each group includes at least two code blocks, and lengths of the code blocks in the group are equal. The total number of code blocks in the C groups of code blocks is K, the at least two of the K code blocks are at least two code blocks in one of the C groups of code blocks, and C is a positive integer greater than or equal to 2.

With reference to the fifth aspect or all the foregoing possible implementations of the fifth aspect, in a fourth possible implementation of the fifth aspect, the receiving apparatus combines the C groups of decoded code blocks based on a code block grouping sequence, to obtain the information transport block sent by a sending apparatus.

With reference to the fifth aspect or all the foregoing possible implementations of the fifth aspect, in a fifth possible implementation of the fifth aspect, the receiving apparatus further includes: a de-concatenation module, configured to de-concatenate the at least two code blocks and the redundant code block sent by the sending apparatus.

With reference to the fifth aspect or all the foregoing possible implementations of the fifth aspect, in a sixth possible implementation of the fifth aspect, the sending apparatus is a terminal device or a satellite base station.

According to a sixth aspect, a receiving apparatus is provided. The receiving apparatus includes:

an obtaining module, configured to obtain to-be-decoded information, where the to-be-decoded information includes log-likelihood ratios obtained after demodulation of at least two of K code blocks of an information transport block and a redundant code block, and the redundant code block is generated based on at least two of the K code blocks; a decoding module, configured to perform decoding based on a log-likelihood ratio obtained after demodulation of each to-be-decoded bit of the at least two code blocks; a third determining module, configured to determine that at least one code block has a decoding error; a fourth determining module, configured to determine, based on a log-likelihood ratio obtained after demodulation of each to-be-decoded bit of the code block having the decoding error and the log-likelihood ratio obtained after demodulation of the redundant code block, an a priori log-likelihood ratio of each to-be-decoded bit of the code block having the decoding error; and a fifth determining module, configured to determine a combined log-likelihood ratio corresponding to each to-be-decoded bit of the code block having the decoding error, where the combined log-likelihood ratio is obtained by adding the a priori log-likelihood ratio of each to-be-decoded bit of the code block having the decoding error and a log-likelihood ratio obtained after demodulation of the bit, where the decoding module is further configured to obtain, based on the combined log-likelihood ratio of each to-be-decoded bit of the code block having the decoding error, a decoding result of the code block having the decoding error.

In a first possible implementation of the sixth aspect, the fourth determining module is further configured to: determine, based on the log-likelihood ratio obtained after demodulation of each to-be-decoded bit and the log-likelihood ratio obtained after demodulation of the redundant code block, a priori probability information about each to-be-decoded bit being decoded as 0 or 1; and determine the a priori log-likelihood ratio of each to-be-decoded bit based on the a priori probability information about each to-be-decoded bit being decoded as 0 or 1.

With reference to the sixth aspect or the first possible implementation of the sixth aspect, in a second possible implementation of the sixth aspect, the fourth determining module is further configured to determine the a priori log-likelihood ratio of each to-be-decoded bit based on the following formula:

$$LLR_{m_{ij}}^{aprior} = \ln\left(\frac{Pr_{ch}^{aprior}(m_{ij}=0)}{Pr_{ch}^{aprior}(m_{ij}=1)}\right),$$

where $LLR_{m_{ij}}^{aprior}$ is an a priori log-likelihood ratio of a $j^{th}$ bit of an $i^{th}$ code block of the K code blocks, $m_{ij}$ is the $j^{th}$ bit of the $i^{th}$ code block of the K code blocks, $Pr_{ch}^{aprior}(m_{ij}=0)$ is a priori probability information about the $j^{th}$ bit of the $i^{th}$ code block of the K code blocks being 0, $Pr_{ch}^{aprior}(m_{ij}=1)$ is a priori probability information about the $j^{th}$ bit of the $i^{th}$ code block of the K code blocks being 1, i is a positive integer less than or equal to K, and j is an integer greater than or equal to 0.

With reference to the sixth aspect or all the foregoing possible implementations of the sixth aspect, in a third possible implementation of the sixth aspect, the third determining module is further configured to determine, based on a cyclic redundancy check, that at least one code block has a decoding error.

With reference to the sixth aspect or all the foregoing possible implementations of the sixth aspect, in a fourth possible implementation of the sixth aspect, the information transport block includes C groups of code blocks, each group includes at least two code blocks, and lengths of the code blocks in the group are equal. The total number of code blocks in the C groups of code blocks is K, the at least two of the K code blocks are at least two code blocks in one of the C groups of code blocks, and C is a positive integer greater than or equal to 2.

With reference to the sixth aspect or all the foregoing possible implementations of the sixth aspect, in a fifth possible implementation of the sixth aspect, the receiving apparatus combines the C groups of decoded code blocks based on a code block grouping sequence, to obtain the information transport block sent by a sending apparatus.

With reference to the sixth aspect or all the foregoing possible implementations of the sixth aspect, in a fifth possible implementation of the sixth aspect, the receiving apparatus further includes: a de-concatenation module, configured to de-concatenate the at least two code blocks and the redundant code block sent by the sending apparatus.

With reference to the sixth aspect or all the foregoing possible implementations of the sixth aspect, in a sixth possible implementation of the sixth aspect, the sending apparatus is a terminal device or a satellite base station.

According to a seventh aspect, a sending apparatus is provided. The sending apparatus includes:
a memory, configured to store a computer program instruction, and a processor, configured to execute the program instruction stored in the memory, where the processor is connected to the memory, and when the user terminal runs, the processor executes the computer program instruction stored in the memory, so that the user terminal performs the information transmission method for satellite communication according to any one of the first aspect of the present invention or all the possible implementations of the first aspect.

In a first possible implementation of the seventh aspect, the sending apparatus further includes: a transceiver, configured to receive and send a signal and information according to any one of the first aspect of the present invention or all the possible implementations of the first aspect.

According to an eighth aspect, a receiving apparatus is provided. The receiving apparatus includes:
a memory, configured to store a computer program instruction, and a processor, configured to execute the program instruction stored in the memory, where the processor is connected to the memory, and when the user terminal runs, the processor executes the computer program instruction stored in the memory, so that the user terminal performs the information transmission method for satellite communication according to any one of the second aspect of the present invention or all the possible implementations of the second aspect or the third aspect of the present invention or all the possible implementations of the third aspect.

In a first possible implementation of the eighth aspect, the sending apparatus further includes: a transceiver, configured to receive and send a signal and information according to any one of the second aspect of the present invention or all the possible implementations of the second aspect or the third aspect of the present invention or all the possible implementations of the third aspect.

According to a ninth aspect, a sending apparatus is provided. The sending apparatus includes:
a unit or a means (means), configured to obtain an information transport block, where the information transport block includes K code blocks, and K is a positive integer greater than or equal to 2;
a unit or a means, configured to generate a redundant code block based on at least two of the K code blocks, where lengths of the at least two code blocks are equal;
a unit or a means, configured to separately perform channel coding on the at least two code blocks and the redundant code block; and
a unit or a means, configured to send the at least two code blocks and the redundant code block on which channel coding has been performed.

In a first possible implementation of the ninth aspect, the unit or the means configured to generate the redundant code block based on the at least two of the K code blocks is further configured to generate, by the sending apparatus, the redundant code block based on the at least two of the K code blocks in a redundant code block generation manner.

With reference to the ninth aspect or the first possible implementation of the ninth aspect, in a second possible implementation of the ninth aspect, the redundant code block generation manner is an exclusive OR operation, a $j^{th}$ bit of the redundant code block is obtained by performing the exclusive OR operation on a $j^{th}$ bit of each of the at least two code blocks, j is an integer greater than 0 and less than or equal to L, and L is a length of each of the at least two code blocks.

With reference to the ninth aspect or all the foregoing possible implementations of the ninth aspect, in a third possible implementation of the ninth aspect, the information transport block includes C groups of code blocks, each group includes at least two code blocks, lengths of the code blocks in the group are equal, the total number of code blocks in the C groups of code blocks is N, and C is a positive integer greater than or equal to 2.

With reference to the ninth aspect or all the foregoing possible implementations of the ninth aspect, in a fourth possible implementation of the ninth aspect, lengths of the K code blocks are all equal, and K is a positive integer.

With reference to the ninth aspect or all the foregoing possible implementations of the ninth aspect, in a fifth possible implementation of the ninth aspect, the information transport block includes C groups of code blocks, each group includes at least two code blocks, and lengths of the code blocks in the group are equal. The total number of code blocks in the C groups of code blocks is K, C is a positive integer greater than or equal to 2, the at least two of the K code blocks are at least two code blocks in one of the C groups of code blocks, and C is a positive integer greater than or equal to 2.

With reference to the ninth aspect or all the foregoing possible implementations of the ninth aspect, in a sixth possible implementation of the ninth aspect, the sending apparatus further includes: a unit or a means configured to concatenate the at least two code blocks and the redundant code block on which channel coding has been performed, and the sending, by the sending apparatus, the at least two code blocks and the redundant code block on which channel coding has been performed includes: sending, by the sending apparatus, the concatenated code blocks.

With reference to the ninth aspect or all the foregoing possible implementations of the ninth aspect, in a sixth possible implementation of the ninth aspect, the sending apparatus is a terminal device or a satellite base station.

According to a tenth aspect, a chip is provided. The chip includes:

an input interface, configured to obtain an information transport block, where the information transport block includes K code blocks, and K is a positive integer greater than or equal to 2;

a processing circuit, configured to: generate a redundant code block based on at least two of the K code blocks, and separately perform channel coding on the at least two code blocks and the redundant code block, where lengths of the at least two code blocks are equal; and an output interface, configured to output the at least two code blocks and the redundant code block on which channel coding has been performed, where the at least two code blocks and the redundant code block on which channel coding has been performed are applicable to transmission on a satellite channel.

In a first possible implementation of the tenth aspect, the processing circuit is specifically configured to generate, by the sending apparatus, the redundant code block based on the at least two of the K code blocks in a redundant code block generation manner.

With reference to the tenth aspect or the first possible implementation of the tenth aspect, in a second possible implementation of the tenth aspect, the redundant code block generation manner is an exclusive OR operation, a $j^{th}$ bit of the redundant code block is obtained by performing the exclusive OR operation on a $j^{th}$ bit of each of the at least two code blocks, j is an integer greater than 0 and less than or equal to L, and L is a length of each of the at least two code blocks.

With reference to the tenth aspect or all the foregoing possible implementations of the tenth aspect, in a third possible implementation of the tenth aspect, the information transport block includes C groups of code blocks, each group includes at least two code blocks, lengths of the code blocks in the group are equal, the total number of code blocks in the C groups of code blocks is N, and C is a positive integer greater than or equal to 2.

With reference to the tenth aspect or all the foregoing possible implementations of the tenth aspect, in a fourth possible implementation of the tenth aspect, lengths of the K code blocks are all equal, and K is a positive integer.

With reference to the tenth aspect or all the foregoing possible implementations of the tenth aspect, in a fifth possible implementation of the tenth aspect, the information transport block includes C groups of code blocks, each group includes at least two code blocks, and lengths of the code blocks in the group are equal. The total number of code blocks in the C groups of code blocks is K, C is a positive integer greater than or equal to 2, the at least two of the K code blocks are at least two code blocks in one of the C groups of code blocks, and C is a positive integer greater than or equal to 2.

With reference to the tenth aspect or all the foregoing possible implementations of the tenth aspect, in a sixth possible implementation of the tenth aspect, the processing circuit is further configured to concatenate the at least two code blocks and the redundant code block on which channel coding has been performed, to obtain concatenated code blocks; and the sending, by the sending apparatus, the at least two code blocks and the redundant code block on which channel coding has been performed includes: sending, by the sending apparatus, the concatenated code blocks.

With reference to the tenth aspect or all the foregoing possible implementations of the tenth aspect, in a sixth possible implementation of the tenth aspect, the sending apparatus is a terminal device or a satellite base station.

According to an eleventh aspect, a computer-readable storage medium is provided, where the computer-readable storage medium stores an instruction, and when the instruction runs on a computer, the computer is enabled to perform the satellite communication method according to any one of the first aspect or all the possible implementations of the first aspect.

According to a twelfth aspect, a computer-readable storage medium is provided, where the computer-readable storage medium stores an instruction, and when the instruction runs on a computer, the computer is enabled to perform the satellite communication method according to any one of the second aspect or all the possible implementations of the second aspect or the third aspect or all the possible implementations of the third aspect.

According to a thirteenth aspect, a computer program product including an instruction is provided, where when the computer program product including the instruction runs on a computer, the computer is enabled to perform the satellite communication method according to any one of the first aspect or all possible implementations of the first aspect.

According to a fourteenth aspect, a computer program product including an instruction is provided, where when the computer program product including the instruction runs on a computer, the computer is enabled to perform the satellite communication method according to any one of the second aspect or all the possible implementations of the second aspect or the third aspect or all the possible implementations of the third aspect.

According to a fifteenth aspect, a receiving apparatus is provided. The receiving apparatus includes:

a unit or a means (means), configured to obtain to-be-decoded information, where the to-be-decoded information includes log-likelihood ratios obtained after demodulation of at least two of K code blocks of an information transport block and a redundant code block, and the redundant code block is generated based on the at least two of the K code blocks;

a unit or a means, configured to perform decoding based on a log-likelihood ratio obtained after demodulation of each to-be-decoded bit of the at least two code blocks;

a unit or a means, configured to determine that at least one code block has a decoding error;

a unit or a means, configured to determine, based on a log-likelihood ratio obtained after demodulation of each to-be-decoded bit of the code block having the decoding error and the log-likelihood ratio obtained after demodulation of the redundant code block, an a priori log-likelihood ratio of each to-be-decoded bit of the code block having the decoding error;

a unit or a means, configured to determine a combined log-likelihood ratio corresponding to each to-be-decoded bit of the code block having the decoding error, where the combined log-likelihood ratio is obtained by adding the a priori log-likelihood ratio of each to-be-decoded bit of the code block having the decoding error and a log-likelihood ratio obtained after demodulation of the bit; and a unit or a means, configured to obtain, based on the combined log-likelihood ratio of each to-be-decoded bit of the code block having the decoding error, a decoding result of the code block having the decoding error.

In a first possible implementation of the fifteenth aspect, the unit or the means based on the log-likelihood ratio obtained after demodulation of each to-be-decoded bit of the code block having the decoding error and the log-likelihood ratio obtained after demodulation of the redundant code block is configured to: determine, based on the log-likelihood ratio obtained after demodulation of each to-be-decoded bit and the log-likelihood ratio obtained after demodulation of the redundant code block, a priori probability information about each to-be-decoded bit being decoded as 0 or 1; and determine the a priori log-likelihood ratio of each to-be-decoded bit based on the a priori probability information about each to-be-decoded bit being decoded as 0 or 1.

With reference to the fifteenth aspect or the first possible implementation of the fifteenth aspect, in a second possible implementation of the fifteenth aspect, the unit or the means based on the log-likelihood ratio obtained after demodulation of each to-be-decoded bit of the code block having the decoding error and the log-likelihood ratio obtained after demodulation of the redundant code block is specifically configured to determine the a priori log-likelihood ratio of each to-be-decoded bit based on the following formula:

$$LLR_{m_{ij}}^{aprior} = \ln\left(\frac{Pr_{ch}^{aprior}(m_{ij}=0)}{Pr_{ch}^{aprior}(m_{ij}=1)}\right),$$

where $LLR_{m_{ij}}^{aprior}$ is an a priori log-likelihood ratio of a $j^{th}$ bit of an $i^{th}$ code block of the K code blocks, $m_{ij}$ is the $j^{th}$ bit of the $i^{th}$ code block of the K code blocks, $Pr_{ch}^{aprior}(m_{ij}=0)$ is a priori probability information about the $j^{th}$ bit of the $i^{th}$ code block of the K code blocks being 0, $Pr_{ch}^{aprior}(m_{ij}=1)$ is a priori probability information about the $j^{th}$ bit of the $i^{th}$ code block of the K code blocks being 1, i is a positive integer less than or equal to K, and j is an integer greater than or equal to 0.

With reference to the fifteenth aspect or all the foregoing possible implementations of the fifteenth aspect, in a third possible implementation of the fifteenth aspect, the unit or the means configured to determine that at least one code block has the decoding error is configured to determine, by the receiving apparatus based on a cyclic redundancy check code, that the at least one code block has the decoding error.

With reference to the fifteenth aspect or all the foregoing possible implementations of the fifteenth aspect, in a fourth possible implementation of the fifteenth aspect, the information transport block includes C groups of code blocks, each group includes at least two code blocks, and lengths of the code blocks in the group are equal. The total number of code blocks in the C groups of code blocks is K, the at least two of the K code blocks are at least two code blocks in one of the C groups of code blocks, and C is a positive integer greater than or equal to 2.

With reference to the fifteenth aspect or all the foregoing possible implementations of the fifteenth aspect, in a fifth possible implementation of the fifteenth aspect, the receiving apparatus combines the C groups of decoded code blocks based on a code block grouping sequence, to obtain the information transport block sent by a sending apparatus.

With reference to the fifteenth aspect or all the foregoing possible implementations of the fifteenth aspect, in a fifth possible implementation of the fifteenth aspect, the sending apparatus further includes: a unit or a means, configured to de-concatenate the at least two code blocks and the redundant code block sent by the sending apparatus.

With reference to the fifteenth aspect or all the foregoing possible implementations of the fifteenth aspect, in a seventh possible implementation of the fifteenth aspect, the sending apparatus is a terminal device or a satellite base station.

In this solution, the information transport block obtained by the sending apparatus includes the plurality of code blocks, the redundant code block is generated based on the at least two of the plurality of code blocks, and the at least two code blocks and the redundant code block are sent to the receiving apparatus over the satellite channel after channel coding. The receiving apparatus receives the sent to-be-decoded information, to obtain the to-be-decoded information of the at least two code blocks and the redundant code block, determines the a priori log-likelihood ratio of the to-be-decoded bit, and combines an a priori log-likelihood ratio of a bit of a to-be-decoded block and a log-likelihood ratio obtained after demodulation, to obtain a diversity gain. Decoding is performed based on the combined log-likelihood ratio, and this solution improves decoding accuracy and reduces a retransmission probability.

BRIEF DESCRIPTION OF DRAWINGS

To describe the technical solutions in the embodiments of the present invention more clearly, the following briefly describes the accompanying drawings for describing the embodiments.

DESCRIPTION OF EMBODIMENTS

Figure 1:
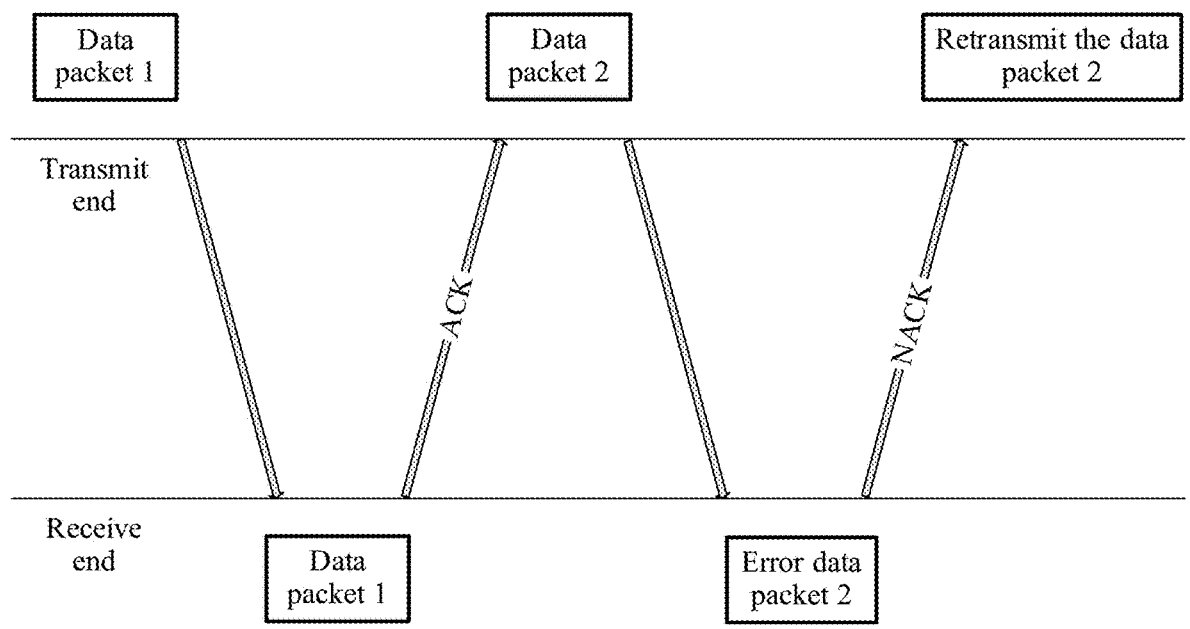
FIG. 1 is a schematic diagram of a HARQ principle.

The following clearly describes the technical solutions in the embodiments of this application with reference to the accompanying drawings in the embodiments of this application. In description of this application, "/" means "or" unless otherwise specified. For example, A/B may represent A or B. In this application, "and/or" describes only an association relationship for describing associated objects and represents that three relationships may exist. For example, A and/or B may represent the following three cases: Only A exists, both A and B exist, and only B exists. In addition, in the descriptions of this application, "a plurality of" refers to two or more. In addition, to help clearly describe the technical solutions in the embodiments of this application, terms such as "first" and "second" are used in the embodiments of this application to distinguish between same items or similar items that have basically same functions and purposes. A person skilled in the art may understand that the terms such as "first" and "second" do not limit a quantity or an execution sequence, and the terms such as "first" and "second" do not indicate a definite difference. A satellite channel mentioned in this application document may also refer to a satellite link or a satellite communication link.

The network architecture and the service scenario described in the embodiments of this application are intended to describe the technical solutions in the embodiments of this application more clearly, and do not constitute a limitation on the technical solutions provided in the embodiments of this application. A person of ordinary skill in the art may know that: with the evolution of the network architecture and the emergence of new service scenarios, the technical solutions provided in the embodiments of this application are also applicable to similar technical problems.

Before the technical solutions of the embodiments of this application are described, a technical scenario of the embodiments of the application is first described with reference to the accompanying drawings.

In a satellite communications system, a satellite base station can provide relay and forwarding services for terrestrial user equipment, and implement wireless communication between two or more user equipment. Compared with a terrestrial base station, the satellite base station has a higher location, is more flexible in deployment, can provide a wider coverage area, and can provide a communications service in areas such as an ocean, a forest, and a high altitude that are difficult to be covered by the terrestrial base station. Therefore, if a satellite communications network is integrated with terrestrial communication such as a 5th generation mobile communications system new radio (5G NR) technology and a long term evolution (LTE) technology, a coverage area of the terrestrial communications network is greatly expanded, to provide a stable communication service for ships, trains, airplanes, and remote areas.

However, because satellite communication and the terrestrial communication vary greatly in specific application scenarios, and in particular, the satellite communication needs to strike a balance between a beam coverage radius and a transmission delay, integration of the satellite communication and the terrestrial communication still faces many problems.

Figure 2:
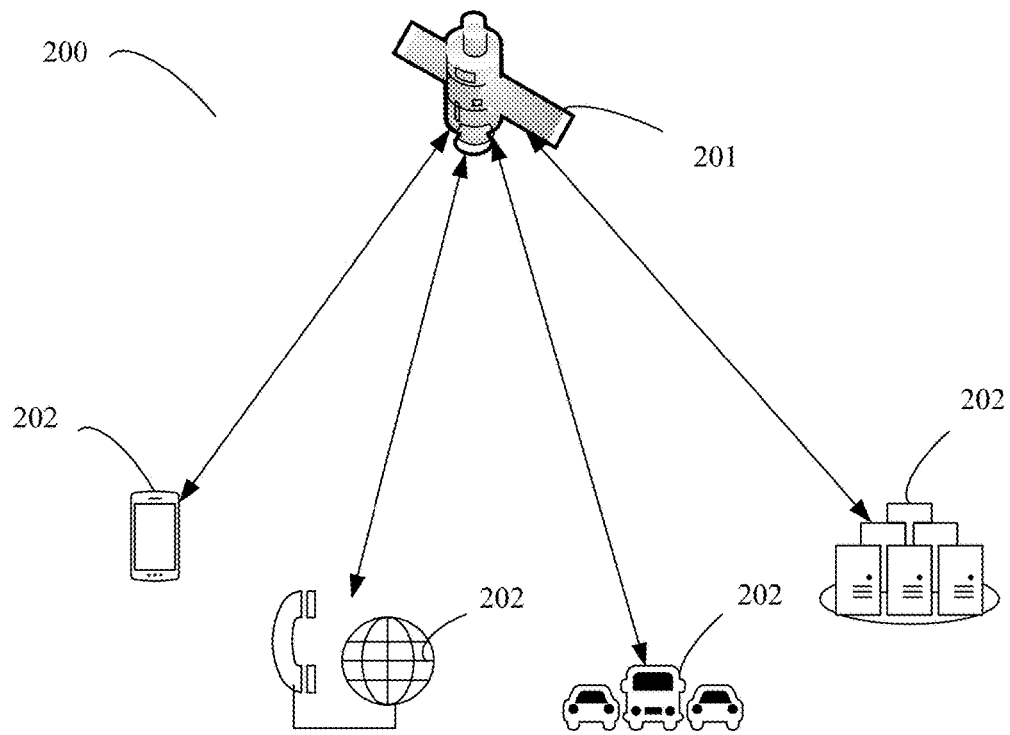
FIG. 2 is a schematic structural diagram of a satellite communications system.

FIG. 2 is a schematic diagram of a satellite communication scenario, including a satellite base station and a terminal device. The satellite base station provides a communication service for the terminal device. The terminal device may be referred to user equipment, an access terminal, a subscriber unit, a subscriber station, a mobile station, a mobile console, a remote station, a remote terminal, a mobile device, a user terminal, a terminal, a wireless communications device, a user agent, a user apparatus, or the like.

The terminal device includes a mobile phone, a tablet computer, a portable notebook computer, a virtual/hybrid/augmented reality device, a navigation device, a terrestrial base station (for example, an eNB and a gNB) and a terrestrial station (GS), a session initiation protocol (SIP) phone, a wireless local loop (WLL) station, a personal digital assistant (PDA), a handheld device with a wireless communication function, a computing device, or another processing device connected to a wireless modem, an in-vehicle device, a wearable device, a terminal device in a 5G network, a terminal device in a future evolved public land mobile network (PLMN) or another future communications system, or the like. This is not limited in this application. Wireless communication between user equipment and a satellite base station may be implemented based on an air interface technology such as a 5th generation mobile communications system new radio (5G NR) technology, a long term evolution (LTE) technology, a global system for mobile communications (GSM), or a universal mobile telecommunications system (UMTS). In an implementation, when the satellite base station transmits downlink data to the terminal device, the transmitted downlink data is transmitted to the terminal after channel coding is first performed and then constellation modulation is performed on the downlink data. When the terminal device transmits uplink data to the satellite base station, the uplink data may be first coded by using channel coding, and the coded data is transmitted to the satellite base station after constellation modulation is performed on the coded data.

In a satellite communications system, a satellite is far away from the ground, and even a low earth orbit satellite is hundreds of kilometers away from the ground (a low earth orbit satellite is 300 km to 2000 km above the ground). An information transmission delay between the satellite base station and a terrestrial user is larger than that of a terrestrial cellular network, and is between tens to hundreds of milliseconds. If a receiving apparatus has a decoding error of a data packet, the sending end needs to retransmit the data packet, or even retransmit the data packet for a plurality of times. A delay caused by this process is usually unacceptable in a satellite communications system. Using a GEO satellite as an example, a transmission delay is about 500 ms. Such a long communication delay seriously affects communication quality when data retransmission is required. In addition, because a coverage range of a satellite is much larger than that of a terrestrial base station, a delay experienced by a terminal device located right below the satellite and a delay experienced by a terminal device located at an edge of a coverage beam radius of the satellite vary greatly. If the HARQ technology is directly used in a satellite communications system, a sending apparatus needs to wait for ACK/NACK feedback from a receiving apparatus. In case of a NACK, the sending apparatus needs to retransmit a data packet until the data packet is correctly received. In the entire process, both ACK/NACK indication information and data information need to be transmitted over a long distance. If a decoding error problem cannot be resolved in one retransmission, a plurality of retransmissions are required. Furthermore, implementing HARQ in satellite communication is highly complex. How to ensure decoding accuracy and avoid delay caused by retransmission is a problem that urgently needs be solved in the satellite communications field.

The information transmission method provided in the embodiments of this application can reduce transmission delay. A sending apparatus obtains an information transport block, where the information transport block includes K code blocks; generates a redundant code block based on at least two of the K code blocks; separately performs channel coding on the at least two code blocks and the redundant code block; and sends, over a satellite channel, the at least two code blocks and the redundant code block on which channel coding has been performed, where K is a positive integer greater than or equal to 2, and the lengths of the at least two code blocks of the sending apparatus are equal. A receiving apparatus obtains to-be-decoded information through a satellite channel; determines an a priori log-likelihood ratio of each to-be-decoded bit based on a log-likelihood ratio obtained after demodulation of the to-be-decoded bit of the at least two code blocks and a log-likelihood ratio obtained after demodulation of the redundant code block; determines a combined log-likelihood ratio of each to-be-decoded bit of the at least two of the K code blocks; and obtains a decoding result of the at least two code blocks based on the combined log-likelihood ratio corresponding to each to-be-decoded bit of the at least two code blocks, where the to-be-decoded information includes the log-likelihood ratios obtained after demodulation of the at least two of the K code blocks of the information transport block and the redundant code block, the redundant code block is generated based on the at least two of the K code blocks, and the combined log-likelihood ratio is obtained by adding the a priori log-likelihood ratio of each to-be-decoded bit and the log-likelihood ratio obtained after demodulation of the to-be-decoded bit.

The redundant code block is generated based on some or all code blocks of the to-be-sent information transport block, so that both the code blocks included in the information transport block and the redundant code block are sent to the receiving apparatus. The receiving apparatus may perform correct decoding based on the redundant code block, thereby greatly reducing the retransmission probability. In satellite communication, a retransmission mechanism may be rarely used or may not be used at all. To be specific, the receiving apparatus performs decoding based on the normally sent information transport block and the extra redundant block. During decoding, decoding may be performed each time based on information contained in the redundant code block, or decoding may be performed based on information contained in the redundant code block only when there is a decoding error. Based on the solutions in this application, decoding accuracy is improved, and a retransmission mechanism may not be needed. For long-distance satellite communication, the delay caused by retransmission is greatly reduced.

Figure 3:
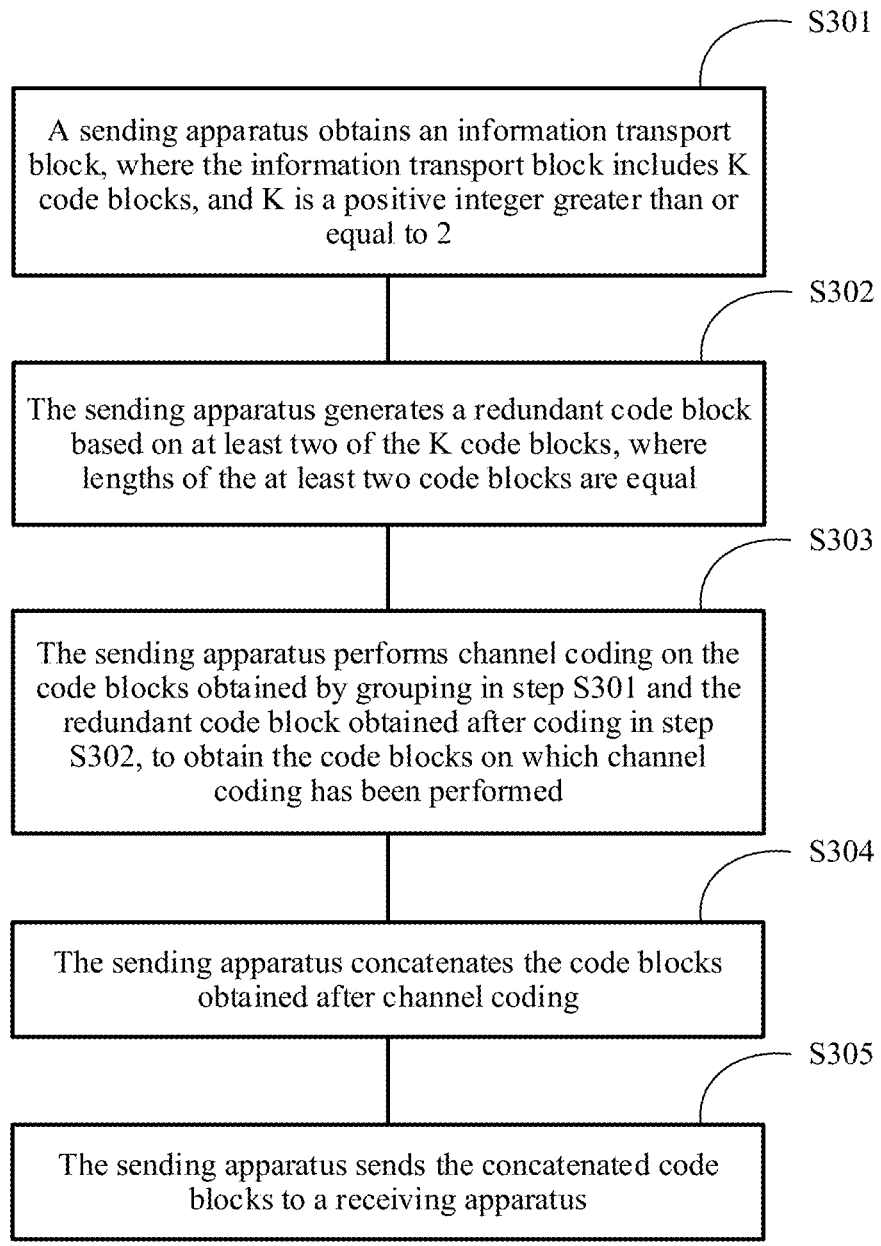
FIG. 3 is a flowchart of a satellite communication method according to this application.

FIG. 3 is a flowchart of a satellite communication method according to this application. The method is applied to a sending apparatus. A terminal device or a satellite base station in satellite communication divides an information transport block into a plurality of code blocks having a same length, jointly codes several code blocks to generate a redundant code block, separately performs channel coding on the code blocks included in the information transport block and the redundant code block, then concatenates the code blocks on which channel coding has been performed, and transmits the code blocks to the satellite base station or the terminal device. As shown in FIG. 3, the method includes the following steps.

Step S301: The sending apparatus obtains an information transport block, where the information transport block includes K code blocks, and K is a positive integer greater than or equal to 2.

For example, the sending apparatus divides the information transport block into the K code blocks each having a length N, where it is denoted that i=1, 2, . . . , K, K indicates a quantity of blocks into which the information transport block is divided, K is a positive integer greater than or equal to 2, and N is a positive integer greater than 0. In the following, meanings of K and N remain unchanged. Details are not described again. An $i^{th}$ code block $B_i$ may be represented as:

$$b_{i1}, b_{i2}, \ldots, b_{i(N-1)}, b_{iN}.$$

The length of the $i^{th}$ code block is N, that is, the code block includes N bits, where N is a positive integer greater than 0. In the following, the meaning of N remains unchanged. Details are not described again.

The sending apparatus may be a satellite base station or a terminal device. In a process in which the satellite base station sends downlink data to the terminal device, the sending apparatus is the satellite base station. In a process in which the terminal device sends uplink data to the satellite base station, the sending apparatus is the terminal device. Details are not described again below.

Step S302: The sending apparatus generates a redundant code block based on at least two of the K code blocks, where lengths of the at least two code blocks are equal.

For example, the sending apparatus jointly codes the K code blocks to obtain a redundant code block Q, and the length of the redundant code block Q is also N. A formula for generating a redundant code block of a $j^{th}$ bit $q_j$ of the redundant code block Q is:

$$q_j = b_{1j} \oplus b_{2j} \oplus \ldots \oplus b_{(K-1)j} \oplus b_{(K)j}, \text{ where}$$

$$J=1, 2, \ldots, N.$$

The redundant code block Q may be represented as:

$$q_1, q_2, \ldots, q_{N-1}, q_N.$$

For example, alternatively, the first K/2 code blocks may be jointly coded to obtain a redundant code block Q1, and the last K/2 code blocks may be jointly coded to obtain a redundant code block Q2.

To be specific, a formula for generating a $j^{th}$ bit $q1_j$ of the redundant code block Q1 is:

$$q1_j = b_{1j} \oplus b_{2j} \oplus \ldots \oplus b_{(K/2-1)j} \oplus b_{(K/2)j}, \text{ where}$$

J=1, 2, . . . , N.

The redundant code block Q1 may be represented as:

$q1_1, q1_2, \ldots, q1_{N-1}, q1_N$.

A formula for generating a $j^{th}$ bit $q2_j$ of the redundant code block Q2 is:

$$q2_j = b_{(\frac{K}{2}+1)j} \oplus b_{(\frac{K}{2}+2)j} \ldots \oplus b_{(K-1)j} \oplus b_{(K)j},$$

where

J=1, 2, . . . , N.

The redundant code block Q2 may be represented as:

$q2_1, q2_2, \ldots, q2_{2N-1}, q2_N$.

In the foregoing example, K/2 code blocks may be further selected, based on a determined rule or randomly, from the K code blocks obtained by block division, to perform coding, and remaining K/2 code blocks are coded. The particular order may be obtained through calculation based on a determined function relationship, or may be obtained by querying a table based on a determined sequence.

In the foregoing example, all the K code blocks obtained by block division are coded. Certainly, some (at least two code blocks) of the K code blocks may be alternatively coded to obtain the redundant code block. In code blocks obtained by grouping described below, some code blocks (at least two code blocks) in each group may be alternatively coded to obtain the redundant code block. This example may be applied to any satellite communication method in the embodiments of this application. Details are not described again below.

In an embodiment, the K code blocks are grouped into C groups, each group includes K/C code blocks, and each group of code blocks is coded, where C is a positive integer greater than 0, and K can be exactly divided by C. In a grouping process, K/C code blocks may be selected from the K code blocks based on a determined rule or a random rule for joint coding, and all the C groups of code blocks are separately coded in this selection manner. The determined rule may be obtained through calculation based on a determined function relationship. For example, four code blocks are numbered as 1, 2, 3, and 4, and need to be divided into two groups. A grouping rule is that a C1 group includes all code blocks $B_{2k-1}$, where k=1 and 2. A C2 group includes all code blocks $B_{2k}$, where k=1 and 2. The grouping rule may alternatively be obtained by querying a table based on a determined sequence. For example, grouping is performed based on consecutive sequential sequences. The determined rule and the random rule are not limited in this application.

Specifically, a quantity K/C of code blocks in each group, that is, a quantity of code blocks on which coding is performed, may be agreed on in advance between the sending apparatus and a receiving apparatus. For example, the K code blocks may be used as one group for coding, or the K code blocks may be divided into two groups and K/2 code blocks are separately coded, or the K code blocks may be divided into three groups and K/3 code blocks are separately coded. The number of C of groups of code blocks is not limited in this application. The foregoing examples are used only for reference. In addition, the sending apparatus may alternatively indicate a quantity of code blocks for coding to the receiving apparatus. Further, a coding method on a per-group basis is provided, and a quantity of code blocks coded in each group may be determined based on the type of a satellite communications system. For example, in a low-earth orbit satellite communications system, the sending apparatus may code the K code blocks. In a satellite communications system designed for a medium earth orbit, the sending apparatus may code K/2 code blocks. In a satellite communications system of a high earth orbit, the sending apparatus may code K/4 code blocks. In this grouping manner, signal fading of satellite communications systems having different orbit heights is considered. A higher orbit height indicates more obvious signal fading. In a specific implementation, a quantity of code blocks in each group is not limited by the example values.

In another embodiment, the K code blocks are grouped into C groups, and each group includes K/C code blocks. Only some code blocks (m code blocks, where m is less than K/C) may be selected for coding, and a rule for selecting some code blocks may be performed based on a determined rule or a random rule. Alternatively, only some bits of a code block may be selected for coding to obtain a redundant code block, and a rule for selecting some bits of a code block may be performed based on a determined rule or a random rule. Certainly, some bits of some code blocks may be selected for coding to obtain a redundant code block, and a rule for selecting some bits of a code block may be performed based on a determined rule or a random rule. Selecting only a part of data for coding to obtain a redundant code block has an advantage of reducing additional overheads for sending information.

Step S303: The sending apparatus performs channel coding on at least two code blocks in a group obtained by grouping in step S301 and the redundant code block obtained after performing coding in step S302, to obtain the code blocks and the redundant code block on which channel coding has been performed.

The code block obtained after channel coding is performed on the code blocks obtained by grouping in step S301 is denoted as $D_i$, and i is a positive integer greater than 0. The code block obtained after channel coding is performed on the redundant code block obtained after coding in step S302 is denoted as E.

To resolve a bit error problem occurred when data is transmitted on a channel, channel coding needs to be performed on the data. The channel coding may be performed by using a Turbo code. One Turbo code coder includes two recursive system convolutional coders (an RSC1 and an RSC2, where an RSC refers to recursive systematic convolutional coder) and one random interleaver. On one hand, a code block $B_i = \{b_{i1}, b_{i2}, \ldots, b_{i(N-1)}, b_{iN}\}$ obtained after grouping enters a first component coder. On the other hand, a new code block $B'_i = \{b'_{i1}, b'_{i2}, \ldots, b'_{i(N-1)}, b'_{iN}\}$ is obtained after processing by the random interleaver, and the new code block is sent to a second component coder. The two component coders respectively generate two different check bit sequences, and the code block and the check bit sequences generated by the two component coders form a code word obtained after channel coding. In the channel coding, a low-density parity-check code (LDPC code) may be alternatively used, and the code block obtained by grouping in step S301 is mapped to a code word sequence by using a generator matrix G. For the generator matrix G, there is a completely equivalent parity-check matrix H, and all code word sequences form zero space of the parity-check matrix.

In addition to the Turbo code and the LDPC code, the channel may alternatively use another channel coding scheme such as a polar code.

This step does not limit the sequence of performing channel coding on the code blocks obtained by grouping in step S301 and the redundant code block obtained after coding in step S302. Channel coding may be simultaneously performed, or may be sequentially performed on the code blocks obtained by grouping in step S301 and the redundant code block obtained after coding in step S302.

Step S304: The sending apparatus concatenates the code blocks obtained after channel coding, to obtain concatenated code blocks.

A concatenating sequence may be agreed on between the sending apparatus and the receiving apparatus in advance. In an embodiment, concatenating may be performed based on the following method. When grouping is not performed, the concatenating sequence is: a code block $D_1$ obtained after channel coding is performed on a first code block, a code block $D_2$ obtained after channel coding is performed on a second code block, . . . , a code block $D_K$ obtained after channel coding is performed on a $K^{th}$ code block, and a code block E obtained after channel coding is performed on a redundant code block obtained after the K code blocks are coded.

In another embodiment, concatenating may be performed based on the following method. When grouping is not performed, the concatenating sequence is: a first bit of a code block $D_1$ obtained after channel coding is performed on a first code block, a first bit of a code block $D_2$ obtained after channel coding is performed on a second code block, . . . , a first bit of a code block $D_K$ obtained after channel coding is performed on a $K^{th}$ code block, and a first bit of a code block E obtained after channel coding is performed on a redundant code block obtained after the K code blocks are coded; a second bit of a code block $D_1$ obtained after channel coding is performed on the first code block, a second bit of the code block $D_2$ obtained after channel coding is performed on the second code block, . . . , a second bit of the code block $D_K$ obtained after channel coding is performed on the $K^{th}$ code block, and a second bit of the code block E obtained after channel coding is performed on the redundant code block obtained after the K code blocks are coded, . . . , and a last bit of the code block $D_1$ obtained after channel coding is performed on the first code block, a last bit of the code block $D_2$ obtained after channel coding is performed on the second code block, . . . , a last bit of the code block $D_K$ obtained after channel coding is performed on the $K^{th}$ code block, and a last bit of the code block E obtained after channel coding is performed on the redundant code block obtained after the K code blocks are coded. Therefore, entire concatenated code blocks are obtained.

In another embodiment, concatenating may be performed based on the following method. When grouping is not performed, the concatenating sequence is: the first bit of the code block $D_1$ obtained after channel coding is performed on the first code block, the first bit of the code block $D_2$ obtained after channel coding is performed on the second code block, . . . , and the first bit of the code block $D_K$ obtained after channel coding is performed on the $K^{th}$ code block; the second bit of the code block $D_1$ obtained after channel coding is performed on the first code block, the second bit of the code block $D_2$ obtained after channel coding is performed on the second code block, . . . , and the second bit of the code block $D_K$ obtained after channel coding is performed on the $K^{th}$ code block; . . . ; and the last bit of the code block $D_1$ obtained after channel coding is performed on the first code block, the last bit of the code block $D_2$ obtained after channel coding is performed on the second code block, . . . , and the last bit of the code block $D_K$ obtained after channel coding is performed on the $K^{th}$ code block; and finally, entire concatenated code blocks are obtained by concatenating the code block E obtained after channel coding is performed on the redundant code block obtained after the K code blocks are coded.

There may be a plurality of code block arrangement orders in the concatenating, and a code block arrangement order is not limited in this step. When grouping is performed, the foregoing embodiments may be implemented in each group.

Step S305: The sending apparatus sends the concatenated code blocks to the receiving apparatus.

Figure 4:
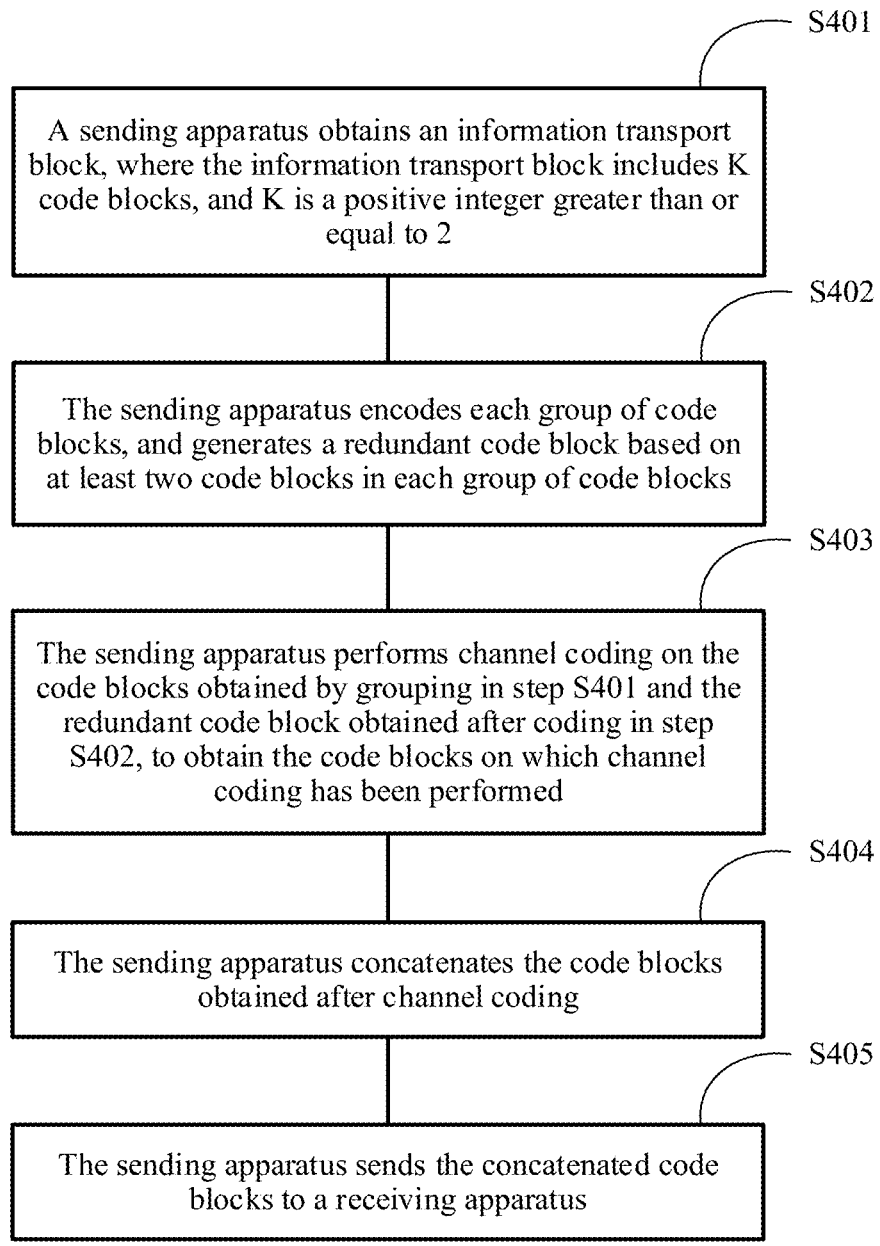
FIG. 4 is a flowchart of a satellite communication method according to this application.

This application provides another satellite communication method, and the method is applied to the sending apparatus (the sending apparatus). A terminal device or a satellite base station in satellite communication divides an information transport block into a plurality of code blocks having different lengths, jointly codes several code blocks having a same length to generate a redundant code block, separately performs channel coding on the code blocks included in the information transport block and the redundant code block, then concatenates the code blocks on which channel coding has been performed, and transmits the code blocks to the satellite base station or the terminal device. FIG. 4 is a flowchart of an information transmission method for satellite communication according to this application. As shown in FIG. 4, the method includes the following steps.

Step S401: The sending apparatus obtains an information transport block, where the information transport block includes K code blocks, and K is a positive integer greater than or equal to 2.

For example, the sending apparatus divides the information transport block into $K_1$ code blocks having a length $N_1$ and $K_2$ code blocks having a length $N_2$, and a sum of $K_1$ and $K_2$ is K. In this case, an $i^{th}$ code block $B_i$ having the length $N_1$ may be represented as:

$$b_{i1}, b_{i2}, \ldots, b_{i(N_1-1)}, b_{iN_1}.$$

It is denoted that i=1, 2, . . . , $K_1$, where $K_1$ represents a quantity of code blocks having the length $N_1$ in the information transport block, and $K_1$ is a positive integer greater than or equal to 2.

The $i^{th}$ code block $R_i$ having the length $N_2$ may be represented as:

$$r_{i1}, r_{i2}, \ldots, r_{i(N_2-1)}, r_{iN_2}.$$

i=1, 2, . . . , $K_2$, where $K_2$ represents a quantity of code blocks having the length $N_2$ in the information transport block, and $K_2$ is a positive integer greater than or equal to 2.

In an embodiment, the sending apparatus may divide the information transport block into a plurality of groups of code blocks having different bit lengths. For example, the information transport block may be divided into $K_1$ code blocks having the length $N_1$, $K_2$ code blocks having the length $N_2$, $K_3$ code blocks having a length $N_3$, . . . , and $K_i$ code blocks having a length $N_i$, where i is a positive integer greater than 1, and code blocks in each group have an equal length.

Step S402: The sending apparatus separately codes each group of code blocks, and generates a redundant code block based on at least two code blocks in each group of code blocks.

For example, the $K_1$ code blocks having the length $N_1$ are jointly coded to obtain a coded redundant code block Q, and a length of the redundant code block Q is also $N_1$. In the redundant code block Q, a formula for generating a redundant code block of a $j^{th}$ bit $q_j$ is:

$$q_j = b_{1j} \oplus b_{2j} \oplus \ldots \oplus b_{(K_1-1)j} \oplus b_{(K_1)j}, \text{ where}$$

$j=1, 2, \ldots, N_1$.

The $K_2$ code blocks having the length $N_2$ are coded to obtain a coded redundant code block P, and a length of the redundant code block P is also $N_2$. A formula for generating a redundant code block of a $i^{th}$ bit $p_j$ of the redundant code block P is:

$$p_j = b_{1j} \oplus b_{2j} \oplus \ldots \oplus b_{(K_2-1)j} \oplus b_{(K_2)j}, \text{ where}$$

$j=1, 2, \ldots, N_2$.

The redundant code block Q may be represented as:

$q_1, q_2, \ldots, q_{N_1-1}, q_{N_1}$.

The redundant code block P may be represented as:

$p_1, p_2, \ldots, p_{N_1-1}, p_{N_1}$.

For example, alternatively, the first $K_1/2$ code blocks may be coded to obtain a redundant code block Q1, and the last $K_1/2$ code blocks may be coded to obtain a redundant code block Q2. That is, each group of code blocks is grouped again, and a new group of code blocks is coded.

A formula for generating the $j^{th}$ bit $q1_j$ of the redundant code block Q1 is:

$$q1_j = b_{1j} \oplus b_{2j} \oplus \ldots \oplus b_{(K_1/2-1)j} \oplus b_{(K_1/2)j}, \text{ where}$$

$j=1, 2, \ldots, N_1$.

The redundant code block Q1 may be represented as:

$q1_1, q1_2, \ldots, q1_{N_1-1}, q1_{N_1}$.

A formula for generating the $i^{th}$ bit $q2_j$ of the redundant code block Q2 is:

$$q2_j = b_{(\frac{K}{2}+1)j} \oplus b_{(\frac{K}{2}+2)j} \ldots \oplus b_{(K-1)j} \oplus b_{(K)j},$$

where $j=1, 2, \ldots, N_1$.

The redundant code block Q2 may be represented as:

$q2_1, q2_2, \ldots, q2_{N_1-1}, q2_{N_1}$.

The first $K_2/2$ code blocks are coded to obtain the redundant code block P1, and the last $K_2/2$ code blocks are coded to obtain the redundant code block P2 by using the same method.

In the foregoing example, $K_1/2$ code blocks may be alternatively selected, according to a determined rule or randomly, from $K_1$ code blocks obtained by block division, to perform coding, and remaining $K_1/2$ code blocks are coded. The particular order may be obtained through calculation based on a determined function relationship, or may be obtained by querying a table based on a determined sequence. The $K_2$ code blocks obtained by block division are coded on a per-group basis by using the same method.

In another embodiment, when the sending apparatus divides the information transport block into a plurality of groups, and lengths of code blocks in the groups are different, because lengths of code blocks in each group are the same, each group of code blocks may be coded. In addition, the grouped code blocks may be grouped again, and the code blocks that are grouped again are coded. For a specific implementation, refer to the method in the embodiment in step S402.

Step S403: The sending apparatus performs channel coding on the code blocks obtained by grouping in step S401 and the redundant code block obtained after coding in step S402, to obtain code blocks on which channel coding has been performed. For a specific channel coding scheme, refer to step S303. Details are not described herein again.

Step S404: The sending apparatus concatenates the code blocks obtained after channel coding, where a concatenating sequence may be agreed on between the sending apparatus and a receiving apparatus in advance. For a specific concatenating manner of the code block and the redundant code block that are obtained after channel coding is performed in each group, refer to step S304. Details are not described herein again.

Step S405: The sending apparatus sends the concatenated code blocks to the receiving apparatus.

This application provides an information transmission method for satellite communication, and the method is applied to a receiving apparatus. The receiving apparatus in satellite communication receives to-be-decoded information sent by a sending apparatus, performs de-concatenating to obtain a log-likelihood ratio of each to-be-decoded bit, calculates an a priori log-likelihood ratio based on the log-likelihood ratio of each to-be-decoded bit and a redundant code block generation formula, combines the a priori log-likelihood ratio of each to-be-decoded bit and a log-likelihood ratio obtained after demodulation to obtain a combined log-likelihood ratio, and performs decoding based on the combined log-likelihood ratio, to obtain a transmitted information bit.

Figure 5:
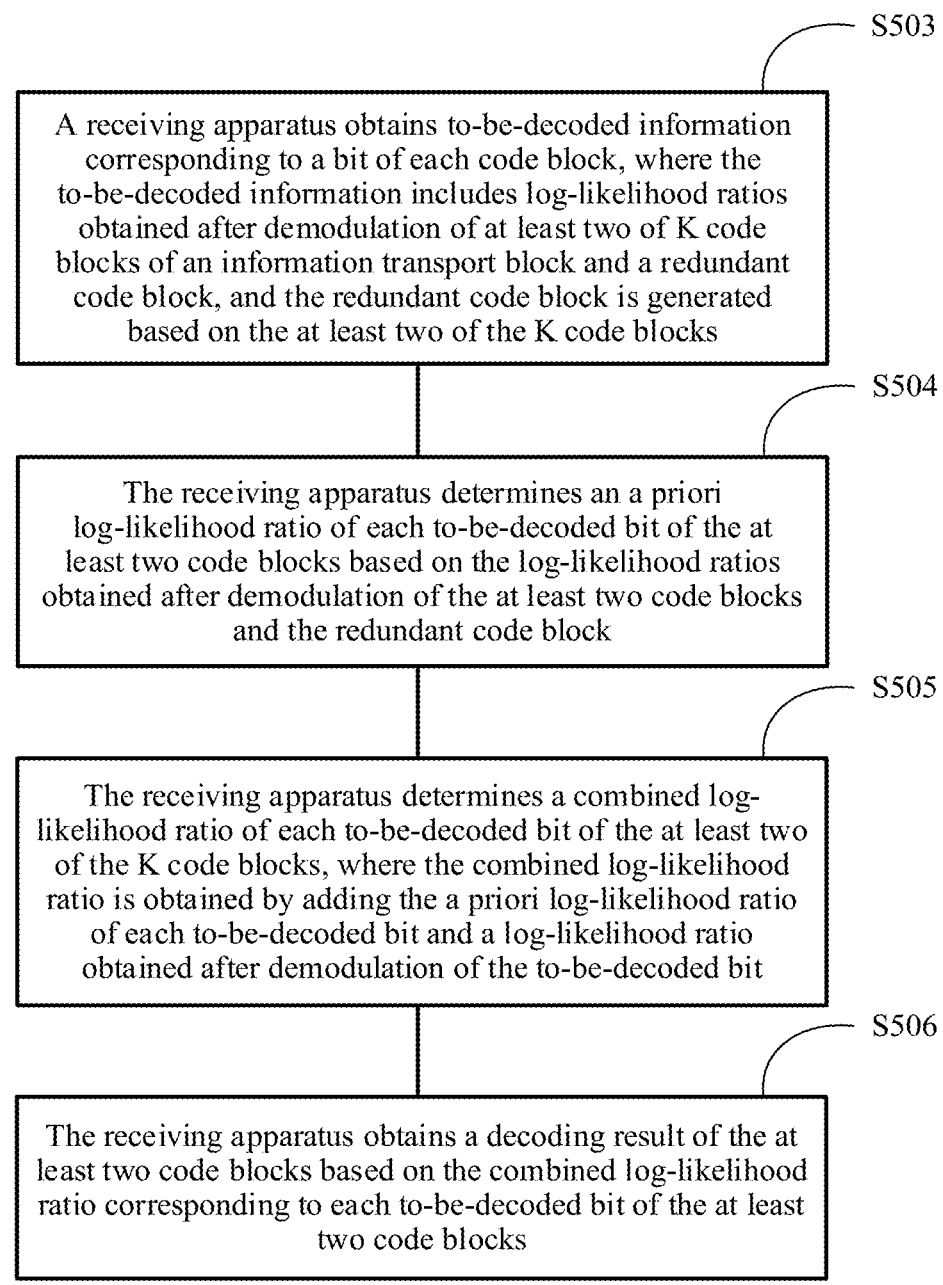
FIG. 5 is a flowchart of a satellite communication method according to this application.

FIG. 5 is a flowchart of an information transmission method for satellite communication according to this application. As shown in FIG. 5, the method includes the following steps.

Step S503. The receiving apparatus obtains to-be-decoded information corresponding to a bit of each code block, where the to-be-decoded information includes log-likelihood ratios obtained after demodulation of at least two of K code blocks of an information transport block and a redundant code block, and the redundant code block is generated based on the at least two of the K code blocks.

The receiving apparatus may be a satellite base station or a terminal device. In a process in which the satellite base station sends downlink data to the terminal device, the receiving apparatus is the terminal device. In a process in which the terminal device sends uplink data to the satellite base station, the receiving apparatus is the satellite base station. Details are not described again below.

The code block includes a code block $D_i$ obtained after channel coding is performed on a code block obtained by grouping and a code block E obtained after channel coding is performed on a redundant code block.

The to-be-decoded information mentioned in this step includes a log-likelihood ratio (LLR) value. The LLR value is usually used for software decoding. In a communication process, regardless of whether the sending apparatus sends a bit 1 or a bit 0, the receiving apparatus may make incorrect determination. The receiving apparatus receives a bit b, and the ratio of the probability of correctly determining the bit as 0 to the probability of correctly determining the bit as 1 is a likelihood ratio. A natural logarithm of the likelihood ratio is obtained to obtain the log-likelihood ratio. A calculation formula is as follows:

$$LLR = \ln\left[\frac{p(r|b=0)}{p(r|b=4)}\right].$$

A calculation formula of the probability p in the formula is related to a modulation scheme and an optimization method. An obtaining method in this application is merely intended for reference, and constitutes no limitation on this application.

Step S504: The receiving apparatus determines an a priori log-likelihood ratio of each to-be-decoded bit of the at least two code blocks based on the log-likelihood ratios obtained after demodulation of the at least two code blocks and the redundant code block.

For example, bits coded by the sending apparatus are $m_1$ and $m_2$, and a redundant code block (a redundant bit) obtained after coding is $m_3$, that is, $m_3 = m_1 \oplus m_2$. The receiving apparatus receives $m_1$, $m_2$, and $m_3$, and obtains to-be-decoded information corresponding to the three bits, where the to-be-decoded information includes log-likelihood ratios of the bits. $Pr_{ch}(m_i = 0)$ is used to indicate a probability of $m_i(i=1, 2, 3)$ being 0, and $Pr_{ch}(m_i = 1)$ is used to indicate a probability of $m_i(i=1, 2, 3)$ being 1. Therefore, $Pr_{ch}(m_i = 1) = 1 - Pr_{ch}(m_i = 0)$.

Based on definition of the log-likelihood ratio, there is the following:

$$LLR_{m_i} = \ln\left(\frac{Pr_{ch}(m_i=0)}{Pr_{ch}(m_i=1)}\right) \quad (1)$$
$$= \ln\left(\frac{Pr_{ch}(m_i=0)}{1-Pr_{ch}(m_i=0)}\right)(i=1,2,3); \text{ and}$$

$$Pr_{ch}(m_i=0) = \frac{e^{LLR_{m_i}}}{1+e^{LLR_{m_i}}}(i=1,2,3). \quad (2)$$

Based on an exclusive OR relationship between $m_1$, $m_2$, and $m_3$, the following may be obtained:

$$Pr_{ch}^{aprior}(m_1=0) = Pr_{ch}(m_3=0)Pr_{ch}(m_1=0|m_3=0) + \quad (3)$$
$$Pr_{ch}(m_3=1)Pr_{ch}(m_1=0|m_3=1)$$
$$= \frac{Pr_{ch}(m_3=0)Pr_{ch}(m_1=0)Pr_{ch}(m_3=0|m_1=0)}{Pr_{ch}(m_1=0)Pr_{ch}(m_3=0|m_1=0)+} +$$
$$Pr_{ch}(m_1=1)Pr_{ch}(m_3=0|m_1=1)$$
$$\frac{Pr_{ch}(m_3=1)Pr_{ch}(m_1=0)Pr_{ch}(m_3=1|m_1=0)}{Pr_{ch}(m_1=0)Pr_{ch}(m_3=1|m_1=0)+}$$
$$Pr_{ch}(m_1=1)Pr_{ch}(m_3=1|m_1=1)$$
$$= \frac{Pr_{ch}(m_1=0)Pr_{ch}(m_2=0)Pr_{ch}(m_3=0)}{Pr_{ch}(m_1=0)Pr_{ch}(m_2=0)+} +$$
$$Pr_{ch}(m_1=1)Pr_{ch}(m_2=1)$$
$$\frac{Pr_{ch}(m_1=0)Pr_{ch}(m_2=1)Pr_{ch}(m_3=1)}{Pr_{ch}(m_1=0)Pr_{ch}(m_2=1)+}.$$
$$Pr_{ch}(m_1=1)Pr_{ch}(m_2=0)$$

$Pr_{ch}^{aprior}(m_1=0)$ is referred to as a priori probability information that is about $m_1$ being 0 and that is derived based on the relationship $m_3 = m_1 \oplus m_2$.

Similarly, a priori probability information that is about $m_1$ being 1 and that is derived based on the relationship $m_3 = m_1 \oplus m_2$ is as follows:

$$Pr_{ch}^{aprior}(m_1=1) = Pr_{ch}(m_3=0)Pr_{ch}(m_1=1|m_3=0) + \quad (4)$$
$$Pr_{ch}(m_3=1)Pr_{ch}(m_1=1|m_3=1)$$
$$= \frac{Pr_{ch}(m_3=0)Pr_{ch}(m_1=1)Pr_{ch}(m_3=0|m_1=1)}{Pr_{ch}(m_1=1)Pr_{ch}(m_3=0|m_1=1)+} +$$
$$Pr_{ch}(m_1=0)Pr_{ch}(m_3=0|m_1=0)$$
$$\frac{Pr_{ch}(m_3=1)Pr_{ch}(m_1=1)Pr_{ch}(m_3=1|m_1=1)}{Pr_{ch}(m_1=0)Pr_{ch}(m_3=1|m_1=0)+}$$
$$Pr_{ch}(m_1=1)Pr_{ch}(m_3=1|m_1=1)$$
$$= \frac{Pr_{ch}(m_1=1)Pr_{ch}(m_2=1)Pr_{ch}(m_3=0)}{Pr_{ch}(m_1=0)Pr_{ch}(m_2=0)+} +$$
$$Pr_{ch}(m_1=1)Pr_{ch}(m_2=1)$$
$$\frac{Pr_{ch}(m_1=1)Pr_{ch}(m_2=0)Pr_{ch}(m_3=1)}{Pr_{ch}(m_1=0)Pr_{ch}(m_2=1)+}.$$
$$Pr_{ch}(m_1=1)Pr_{ch}(m_2=0)$$

With reference to formulas (3) and (4), an a priori log-likelihood ratio of $m_1$ may be obtained as follows:

$$LLR_{m_1}^{aprior} = \log\left(\frac{Pr_{ch}^{aprior}(m_1=0)}{Pr_{ch}^{aprior}(m_1=1)}\right). \quad (5)$$

In addition, a priori probability information that is about $m_2$ being 0 and that is derived based on the relationship $m_3 = m_1 \oplus m_2$ and a priori probability information that is about $m_2$ being 1 and that is derived based on the relationship $m_3 = m_1 \oplus m_2$ are shown in formula (6) and formula (7) respectively:

$$Pr_{ch}^{aprior}(m_2=0) = Pr_{ch}(m_3=0)Pr_{ch}(m_2=0|m_3=0) + \quad (6)$$
$$Pr_{ch}(m_3=1)Pr_{ch}(m_2=0|m_3=1)$$
$$= \frac{Pr_{ch}(m_3=0)Pr_{ch}(m_2=0)Pr_{ch}(m_3=0|m_2=0)}{Pr_{ch}(m_2=0)Pr_{ch}(m_3=0|m_2=0)+} +$$
$$Pr_{ch}(m_2=1)Pr_{ch}(m_3=0|m_2=1)$$
$$\frac{Pr_{ch}(m_3=1)Pr_{ch}(m_2=0)Pr_{ch}(m_3=1|m_2=0)}{Pr_{ch}(m_2=0)Pr_{ch}(m_3=1|m_2=0)+}$$
$$Pr_{ch}(m_2=1)Pr_{ch}(m_3=1|m_2=1)$$
$$= \frac{Pr_{ch}(m_1=0)Pr_{ch}(m_2=0)Pr_{ch}(m_3=0)}{Pr_{ch}(m_1=0)Pr_{ch}(m_2=0)+} +$$
$$Pr_{ch}(m_1=1)Pr_{ch}(m_2=1)$$
$$\frac{Pr_{ch}(m_1=1)Pr_{ch}(m_2=0)Pr_{ch}(m_3=1)}{Pr_{ch}(m_1=1)Pr_{ch}(m_2=0)+};$$
$$Pr_{ch}(m_1=0)Pr_{ch}(m_2=1)$$

and

-continued $$Pr_{ch}^{aprior}(m_2 = 1) = Pr_{ch}(m_3 = 0)Pr_{ch}(m_2 = 1 \mid m_3 = 0) + \quad (7)$$
$$Pr_{ch}(m_3 = 1)Pr_{ch}(m_2 = 1 \mid m_3 = 1)$$
$$= \frac{Pr_{ch}(m_3 = 0)Pr_{ch}(m_2 = 1)Pr_{ch}(m_3 = 0 \mid m_2 = 1)}{Pr_{ch}(m_2 = 0)Pr_{ch}(m_3 = 0 \mid m_2 = 0) +} +$$
$$Pr_{ch}(m_2 = 1)Pr_{ch}(m_3 = 0 \mid m_2 = 1)$$
$$\frac{Pr_{ch}(m_3 = 1)Pr_{ch}(m_2 = 1)Pr_{ch}(m_3 = 1 \mid m_2 = 1)}{Pr_{ch}(m_2 = 0)Pr_{ch}(m_3 = 1 \mid m_2 = 0) +}$$
$$Pr_{ch}(m_2 = 1)Pr_{ch}(m_3 = 1 \mid m_2 = 1)$$
$$= \frac{Pr_{ch}(m_1 = 1)Pr_{ch}(m_2 = 1)Pr_{ch}(m_3 = 0)}{Pr_{ch}(m_1 = 0)Pr_{ch}(m_2 = 0) +} +$$
$$Pr_{ch}(m_1 = 1)Pr_{ch}(m_2 = 1)$$
$$\frac{Pr_{ch}(m_1 = 0)Pr_{ch}(m_2 = 1)Pr_{ch}(m_3 = 1)}{Pr_{ch}(m_1 = 1)Pr_{ch}(m_2 = 0) +}.$$
$$Pr_{ch}(m_1 = 0)Pr_{ch}(m_2 = 1)$$

Therefore, an a priori log-likelihood ratio of $m_2$ is as follows:

$$LLR_{m_2}^{aprior} = \log\left(\frac{Pr_{ch}^{aprior}(m_2 = 0)}{Pr_{ch}^{aprior}(m_2 = 1)}\right). \quad (8)$$

Step S505: The receiving apparatus determines a combined log-likelihood ratio of each to-be-decoded bit of the at least two of the K code blocks, where the combined log-likelihood ratio is obtained by adding the a priori log-likelihood ratio of each to-be-decoded bit and a log-likelihood ratio obtained after demodulation of the to-be-decoded bit.

For example, the receiving apparatus adds calculated a priori log-likelihood ratios of $m_1$, $m_2$ and LLR values obtained after demodulation of $m_1$, $m_2$ to obtain the combined log-likelihood ratio $LLR_{m_i}^{app}$, to obtain a diversity gain. The combined log-likelihood ratio is calculated by using the following formula:

$$LLR_{m_i}^{app} = LLR_{m_i} + LLR_{m_i}^{aprior} (i=1, 2) \quad (9).$$

Step S506: The receiving apparatus obtains a decoding result of the at least two code blocks based on the combined log-likelihood ratio corresponding to each to-be-decoded bit of the at least two code blocks.

The foregoing steps are general steps of obtaining a diversity gain by the receiving apparatus. Specifically, when a transmit end divides the information transport block into groups, the information transport block is divided into C groups of code blocks, each group includes at least two code blocks, lengths of the code blocks in the group are equal, the total number of code blocks in the C groups of code blocks is K, at least two of the K code blocks are at least two code blocks in one of the C groups of code blocks, and C is a positive integer greater than or equal to 2. The receiving apparatus separately performs the foregoing steps on each group of code blocks to calculate a combined log-likelihood ratio of a bit of each code block, to obtain a code block in each group of code blocks. The receiving apparatus combines the C groups of decoded code blocks based on a sequence of grouping the code blocks, to obtain the information transport block sent by the sending apparatus. An information transmission method of the receiving apparatus described below is also applicable. Details are not described again.

Figure 6:
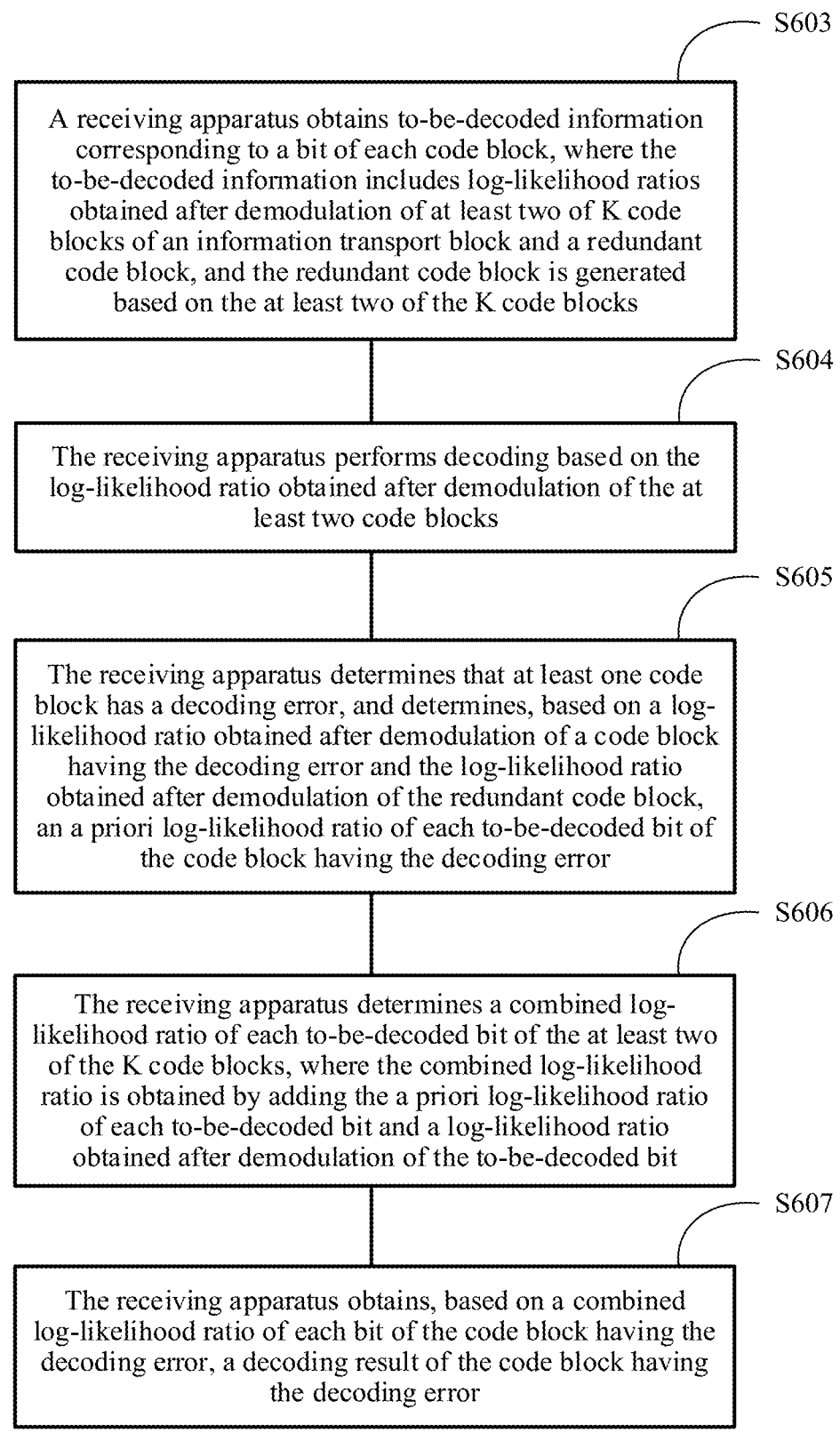
FIG. 6 is a flowchart of a satellite communication method according to this application.

This application provides another satellite communication method, and the method is applied to a receiving apparatus (a receiving apparatus). The receiving apparatus in satellite communication receives to-be-decoded information sent by a sending apparatus, obtains a log-likelihood ratio of each to-be-decoded bit, first performs decoding by using the log-likelihood ratio, if verification of a verification code succeeds, determines that decoding is correct and obtains a decoded information transport block, or if verification of a verification code fails, continues to calculate an a priori log-likelihood ratio of each to-be-decoded bit, combines the a priori log-likelihood ratio and a log-likelihood ratio obtained after demodulation of each to-be-decoded bit to obtain a combined log-likelihood ratio, and performs decoding based on the combined log-likelihood ratio, to obtain a transmitted information bit. This method can reduce calculation overheads and a calculation amount. FIG. 6 is a flowchart of another satellite communication method according to this application. As shown in FIG. 6, the method includes the following steps.

Step S603. The receiving apparatus obtains to-be-decoded information corresponding to a bit of each code block, where the to-be-decoded information includes log-likelihood ratios obtained after demodulation of at least two of K code blocks of an information transport block and a redundant code block, and the redundant code block is generated based on the at least two of the K code blocks.

Step S604: The receiving apparatus performs decoding based on the log-likelihood ratio obtained after demodulation of the at least two code blocks.

If verification of a verification code succeeds, the following steps are no longer performed. If verification of a verification code fails, the following steps continue to be performed. A cyclic redundancy check (CRC) may be used as the verification code.

Step S605: The receiving apparatus determines that at least one code block has a decoding error, and determines, based on a log-likelihood ratio obtained after demodulation of the code block having the decoding error and the log-likelihood ratio obtained after demodulation of the redundant code block, an a priori log-likelihood ratio of each to-be-decoded bit of the code block having the decoding error. For a method for determining the a priori log-likelihood ratio, refer to step S504. Details are not described herein again.

Step S606: The receiving apparatus determines a combined log-likelihood ratio of each to-be-decoded bit of the at least two of the K code blocks, where the combined log-likelihood ratio is obtained by adding the a priori log-likelihood ratio of each to-be-decoded bit and a log-likelihood ratio obtained after demodulation of the to-be-decoded bit.

Step S607: The receiving apparatus obtains, based on a combined log-likelihood ratio of each bit of the code block having the decoding error, a decoding result of the code block having the decoding error.

The sending apparatus and the receiving apparatus provided by the embodiments of this application are briefly described below with reference to FIG. 7 to FIG. 10, and are configured to perform the method or the process of each embodiment described above. Content of the foregoing embodiments is applicable to the embodiments of FIG. 7 to FIG. 10, and is no longer described in detail.

Figure 7:
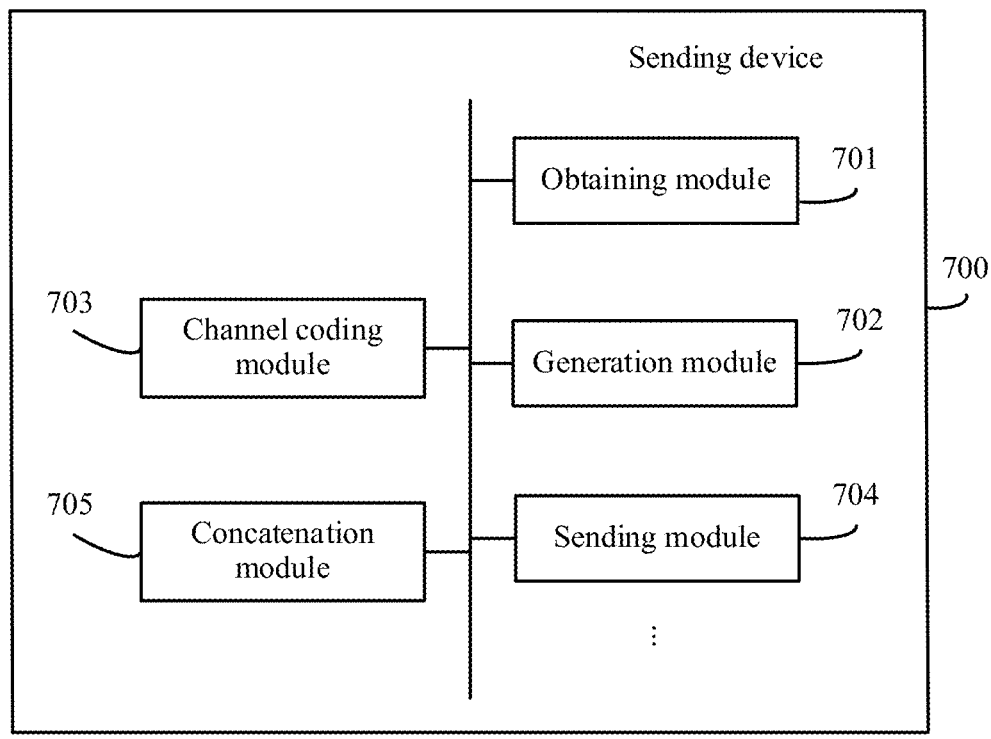
FIG. 7 is a schematic structural diagram of a sending apparatus 700 according to this application.

FIG. 7 is a schematic structural diagram of a sending apparatus 700 according to this application. The sending apparatus 700 includes:

an obtaining module 701, configured to obtain an information transport block, where the information transport block includes K code blocks, and K is a positive integer greater than or equal to 2;

a generation module 702, configured to generate a redundant code block based on at least two of the K code blocks, where lengths of the at least two code blocks are equal;

a channel coding module 703, configured to separately perform channel coding on the at least two code blocks and the redundant code block; and a sending module 704, configured to send the at least two code blocks and the redundant code block.

Optionally, the generation module 702 is configured to generate the redundant code block based on the at least two of the K code blocks in a redundant code block generation manner.

Optionally, the redundant code block generation manner is an exclusive OR operation, a $j^{th}$ bit of the redundant code block is obtained by performing the exclusive OR operation on a $j^{th}$ bit of each of the at least two code blocks, j is an integer greater than 0 and less than or equal to L, and L is a length of each of the at least two code blocks.

Optionally, lengths of the K code blocks are all equal, and K is a positive integer.

Optionally, the information transport block includes C groups of code blocks, each group includes at least two code blocks, and lengths of the code blocks in the group are equal. The total number of code blocks in the C groups of code blocks is K, C is a positive integer greater than or equal to 2, the at least two of the K code blocks are at least two code blocks in one of the C groups of code blocks, and C is a positive integer greater than or equal to 2.

Optionally, the sending apparatus further includes: a concatenation module 705, configured to concatenate the at least two code blocks and the redundant code block on which channel coding has been performed, to obtain concatenated code blocks; and the sending, by the sending apparatus, the at least two code blocks and the redundant code block on which channel coding has been performed includes: sending, by the sending apparatus, the concatenated code blocks.

Optionally, the sending apparatus is a terminal device or a satellite base station.

This application further provides a sending apparatus. The sending apparatus includes:

a unit or a means (means) configured to obtain an information transport block, where the information transport block includes K code blocks, and K is a positive integer greater than or equal to 2;

a unit or a means, configured to generate a redundant code block based on at least two of the K code blocks, where lengths of the at least two code blocks are equal;

a unit or a means, configured to separately perform channel coding on the at least two code blocks and the redundant code block; and a unit or a means, configured to send the at least two code blocks and the redundant code block on which channel coding has been performed.

Optionally, the unit or the means configured to generate the redundant code block based on the at least two of the K code blocks is further configured to generate, by the sending apparatus, the redundant code block based on the at least two of the K code blocks in a redundant code block generation manner.

Optionally, the redundant code block generation manner is an exclusive OR operation, a $j^{th}$ bit of the redundant code block is obtained by performing the exclusive OR operation on a $j^{th}$ bit of each of the at least two code blocks, j is an integer greater than 0 and less than or equal to L, and L is a length of each of the at least two code blocks.

Optionally, the information transport block includes C groups of code blocks, each group includes at least two code blocks, lengths of the code blocks in the group are equal, the total number of code blocks in the C groups of code blocks is N, and C is a positive integer greater than or equal to 2.

Optionally, lengths of the K code blocks are all equal, and K is a positive integer.

Optionally, the information transport block includes C groups of code blocks, each group includes at least two code blocks, and lengths of the code blocks in the group are equal. The total number of code blocks in the C groups of code blocks is K, C is a positive integer greater than or equal to 2, the at least two of the K code blocks are at least two code blocks in one of the C groups of code blocks, and C is a positive integer greater than or equal to 2.

Optionally, the sending apparatus further includes: a unit or a means, configured to concatenate the at least two code blocks and the redundant code block on which channel coding has been performed; and the sending, by the sending apparatus, the at least two code blocks and the redundant code block on which channel coding has been performed includes: sending, by the sending apparatus, the concatenated code blocks.

Optionally, the sending apparatus is a terminal device or a satellite base station.

Other methods may be obtained based on steps and procedures or a combination of some of the steps and procedures in content provided in the embodiments of this application. Based on these obtained methods and steps, a corresponding apparatus is provided, including units, modules, means, or a combination thereof that are separately configured to perform the methods and the steps.

Figure 8:
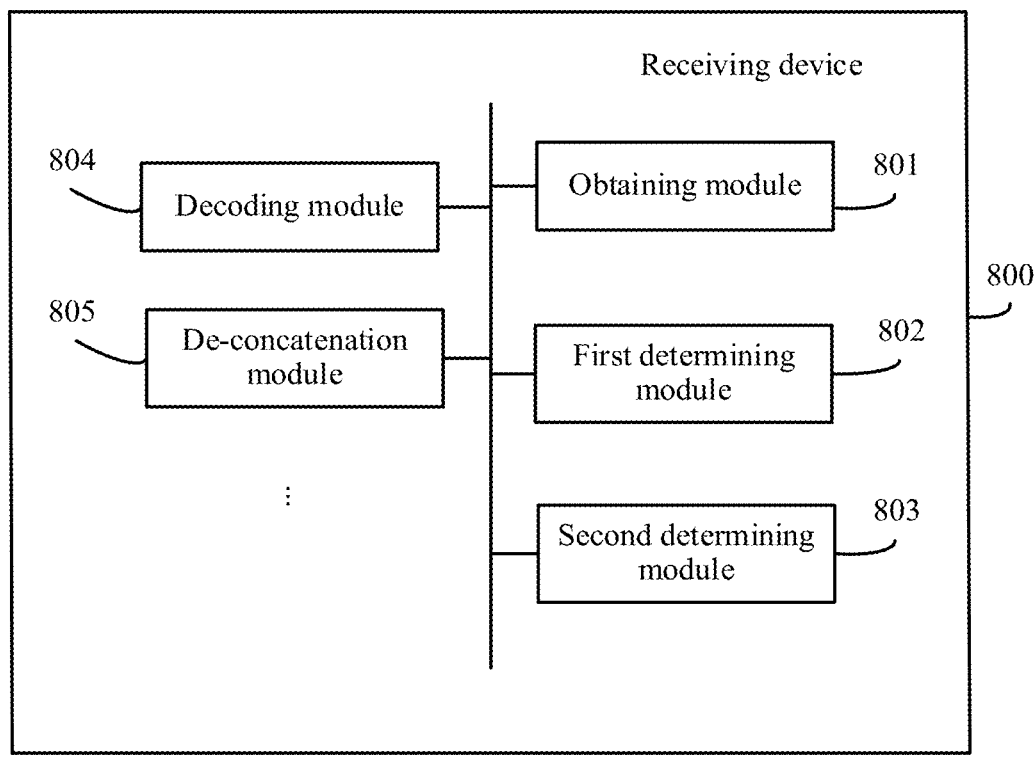
FIG. 8 is a schematic structural diagram of a receiving apparatus 800 according to this application.

FIG. 8 is a schematic structural diagram of a receiving apparatus 800 according to this application. The receiving apparatus 800 includes:

an obtaining module 801, configured to obtain to-be-decoded information, where the to-be-decoded information includes log-likelihood ratios obtained after demodulation of at least two of K code blocks of an information transport block and a redundant code block, and the redundant code block is generated based on the at least two of the K code blocks;

a first determining module 802, configured to determine an a priori log-likelihood ratio of each to-be-decoded bit based on a log-likelihood ratio obtained after demodulation of the to-be-decoded bit and the log-likelihood ratio obtained after demodulation of the redundant code block;

a second determining module 803, configured to determine a combined log-likelihood ratio of each to-be-decoded bit of the at least two of the K code blocks, where the combined log-likelihood ratio is obtained by adding the a priori log-likelihood ratio of each to-be-decoded bit and the log-likelihood ratio obtained after demodulation of the to-be-decoded bit; and a decoding module 804, configured to obtain a decoding result of the at least two code blocks based on the combined log-likelihood ratio corresponding to each to-be-decoded bit of the at least two code blocks.

Optionally, the first determining module 802 is specifically configured to: determine, based on the log-likelihood ratio obtained after demodulation of each to-be-decoded bit and the log-likelihood ratio obtained after demodulation of the redundant code block, a priori probability information about each to-be-decoded bit being decoded as 0 or 1; and determine the a priori log-likelihood ratio of each to-be-decoded bit based on the a priori probability information about each to-be-decoded bit being decoded as 0 or 1.

Optionally, the second determining module 802 is specifically configured to determine the a priori log-likelihood ratio of each to-be-decoded bit based on the following formula:

$$LLR_{m_{ij}}^{aprior} = \log\left(\frac{Pr_{ch}^{aprior}(m_{ij} = 0)}{Pr_{ch}^{aprior}(m_{ij} = 1)}\right),$$

where $LLR_{m_{ij}}^{aprior}$ is an a priori log-likelihood ratio of a $j^{th}$ bit of an $i^{th}$ code block of the K code blocks, $m_{ij}$ is the $j^{th}$ bit of the $i^{th}$ code block of the K code blocks, $Pr_{ch}^{aprior}(m_{ij}=0)$ is a priori probability information about the $j^{th}$ bit of the $i^{th}$ code block of the K code blocks being 0, $Pr_{ch}^{aprior}(m_{ij}=1)$ is a priori probability information about the $j^{th}$ bit of the $i^{th}$ code block of the K code blocks being 1, i is a positive integer less than or equal to K, and j is an integer greater than or equal to 0.

Optionally, the information transport block includes C groups of code blocks, each group includes at least two code blocks, and lengths of the code blocks in the group are equal. The total number of code blocks in the C groups of code blocks is K, the at least two of the K code blocks are at least two code blocks in one of the C groups of code blocks, and C is a positive integer greater than or equal to 2.

Optionally, the receiving apparatus combines the C groups of decoded code blocks based on a code block grouping sequence, to obtain the information transport block sent by the sending apparatus.

Optionally, the sending apparatus further includes: a de-concatenation module 805, configured to de-concatenate the at least two code blocks and the redundant code block sent by the sending apparatus.

Optionally, the sending apparatus is a terminal device or a satellite base station.

This application further provides a receiving apparatus. The receiving apparatus includes:

a unit or a means (means), configured to obtain to-be-decoded information, where the to-be-decoded information includes log-likelihood ratios obtained after demodulation of at least two of K code blocks of an information transport block and a redundant code block, and the redundant code block is generated based on the at least two of the K code blocks;

a unit or a means, configured to determine an a priori log-likelihood ratio of each to-be-decoded bit based on a log-likelihood ratio obtained after demodulation of the to-be-decoded bit and the log-likelihood ratio obtained after demodulation of the redundant code block;

a unit or a means, configured to determine a combined log-likelihood ratio of each to-be-decoded bit of the at least two of the K code blocks, where the combined log-likelihood ratio is obtained by adding the a priori log-likelihood ratio of each to-be-decoded bit and the log-likelihood ratio obtained after demodulation of the to-be-decoded bit; and a unit or a means, configured to obtain a decoding result of the at least two code blocks based on the combined log-likelihood ratio corresponding to each to-be-decoded bit of the at least two code blocks.

Optionally, the unit or the means configured to determine an a priori log-likelihood ratio of each to-be-decoded bit based on a log-likelihood ratio obtained after demodulation of the to-be-decoded bit and the log-likelihood ratio obtained after demodulation of the redundant code block is specifically configured to: determine, based on the log-likelihood ratio obtained after demodulation of each to-be-decoded bit and the log-likelihood ratio obtained after demodulation of the redundant code block, a priori probability information about each to-be-decoded bit being decoded as 0 or 1; and determine the a priori log-likelihood ratio of each to-be-decoded bit based on the a priori probability information about each to-be-decoded bit being decoded as 0 or 1.

Optionally, the unit or the means configured to determine a combined log-likelihood ratio of each to-be-decoded bit of the at least two of the K code blocks is specifically configured to determine the a priori log-likelihood ratio of each to-be-decoded bit based on the following formula:

$$LLR_{m_{ij}}^{aprior} = \log\left(\frac{Pr_{ch}^{aprior}(m_{ij} = 0)}{Pr_{ch}^{aprior}(m_{ij} = 1)}\right),$$

where $LLR_{m_{ij}}^{aprior}$ is an a priori log-likelihood ratio of a $j^{th}$ bit of an $i^{th}$ code block of the K code blocks, $m_{ij}$ is the $j^{th}$ bit of the $i^{th}$ code block of the K code blocks, $Pr_{ch}^{aprior}(m_{ij}=0)$ is a priori probability information about the $j^{th}$ bit of the $i^{th}$ code block of the K code blocks being 0, $Pr_{ch}^{aprior}(m_{ij}=1)$ is a priori probability information about the $j^{th}$ bit of the $i^{th}$ code block of the K code blocks being 1, i is a positive integer less than or equal to K, and j is an integer greater than or equal to 0.

Optionally, the information transport block includes C groups of code blocks, each group includes at least two code blocks, and lengths of the code blocks in the group are equal. The total number of code blocks in the C groups of code blocks is K, the at least two of the K code blocks are at least two code blocks in one of the C groups of code blocks, and C is a positive integer greater than or equal to 2.

Optionally, the receiving apparatus combines the C groups of decoded code blocks based on a code block grouping sequence, to obtain the information transport block sent by the sending apparatus.

Optionally, the sending apparatus further includes: a unit or a means, configured to de-concatenate the at least two code blocks and the redundant code block sent by the sending apparatus.

Optionally, the sending apparatus is a terminal device or a satellite base station.

Other methods may be obtained based on steps and procedures or a combination of some of the steps and procedures in content provided in the embodiments of this application. Based on these obtained methods and steps, a corresponding apparatus is provided, including units, modules, means, or a combination thereof that are separately configured to perform the methods and the steps.

Figure 9:
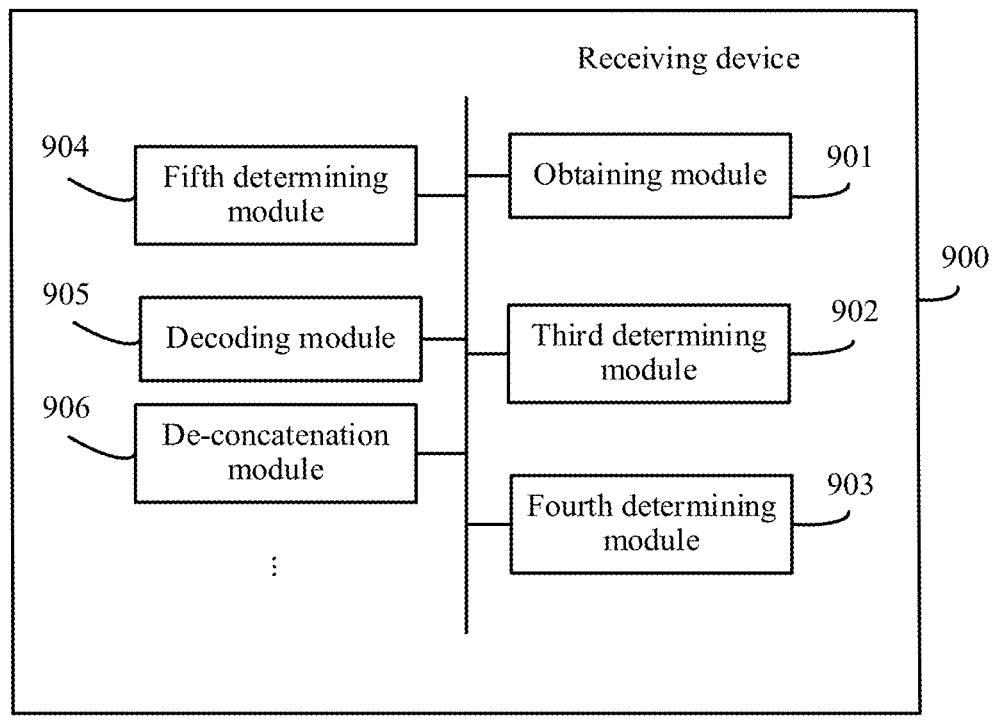
FIG. 9 is a schematic structural diagram of a receiving apparatus 900 according to this application.

FIG. 9 is a schematic structural diagram of a receiving apparatus 900 according to this application. The receiving apparatus 900 includes:

an obtaining module 901, configured to obtain to-be-decoded information, where the to-be-decoded information includes log-likelihood ratios obtained after demodulation of at least two of K code blocks of an information transport block and a redundant code block, and the redundant code block is generated based on the at least two of the K code blocks;

a decoding module 905, configured to perform decoding based on a log-likelihood ratio obtained after demodulation of each to-be-decoded bit of the at least two code blocks;

a third determining module 902, configured to determine that at least one code block has a decoding error;

a fourth determining module 903, configured to determine, based on a log-likelihood ratio obtained after demodulation of each to-be-decoded bit of the code block having the decoding error and the log-likelihood ratio obtained after demodulation of the redundant code block, an a priori log-likelihood ratio of each to-be-decoded bit of the code block having the decoding error; and a fifth determining module 904, configured to determine a combined log-likelihood ratio corresponding to each to-be-decoded bit of the code block having the decoding error, where the combined log-likelihood ratio is obtained by adding the a priori log-likelihood ratio of each to-be-decoded bit of the code block having the decoding error and a log-likelihood ratio obtained after demodulation of the bit, where the decoding module 905 is further configured to obtain, based on the combined log-likelihood ratio of each to-be-decoded bit of the code block having the decoding error, a decoding result of the code block having the decoding error.

Optionally, the fourth determining module 903 is specifically configured to: determine, based on the log-likelihood ratio obtained after demodulation of each to-be-decoded bit and the log-likelihood ratio obtained after demodulation of the redundant code block, a priori probability information about each to-be-decoded bit being decoded as 0 or 1; and determine the a priori log-likelihood ratio of each to-be-decoded bit based on the a priori probability information about each to-be-decoded bit being decoded as 0 or 1.

Optionally, the fourth determining module 903 is specifically configured to determine the a priori log-likelihood ratio of each to-be-decoded bit based on the following formula:

$$LLR_{m_{ij}}^{aprior} = \log\left(\frac{Pr_{ch}^{aprior}(m_{ij} = 0)}{Pr_{ch}^{aprior}(m_{ij} = 1)}\right),$$

where $LLR_{m_{ij}}^{aprior}$ is an a priori log-likelihood ratio of a $j^{th}$ bit of an $i^{th}$ code block of the K code blocks, $m_{ij}$ is the $j^{th}$ bit of the $i^{th}$ code block of the K code blocks, $Pr_{ch}^{aprior}(m_{ij}=0)$ is a priori probability information about the $j^{th}$ bit of the $i^{th}$ code block of the K code blocks being 0, $Pr_{ch}^{aprior}(m_{ij}=1)$ is a priori probability information about the $j^{th}$ bit of the $i^{th}$ code block of the K code blocks being 1, i is a positive integer less than or equal to K, and j is an integer greater than or equal to 0.

Optionally, the third determining module is specifically configured to determine, by the receiving apparatus based on a cyclic redundancy check code, that the at least one code block has the decoding error.

Optionally, the information transport block includes C groups of code blocks, each group includes at least two code blocks, and lengths of the code blocks in the group are equal. The total number of code blocks in the C groups of code blocks is K, the at least two of the K code blocks are at least two code blocks in one of the C groups of code blocks, and C is a positive integer greater than or equal to 2.

Optionally, the receiving apparatus combines the C groups of decoded code blocks based on a code block grouping sequence, to obtain the information transport block sent by the sending apparatus.

Optionally, the sending apparatus further includes: a de-concatenation module 906, configured to de-concatenate the at least two code blocks and the redundant code block sent by the sending apparatus.

Optionally, the sending apparatus is a terminal device or a satellite base station.

This application further provides a receiving apparatus. The receiving apparatus includes:

a unit or a means (means) configured to obtain to-be-decoded information, where the to-be-decoded information includes log-likelihood ratios obtained after demodulation of at least two of K code blocks of an information transport block and a redundant code block, and the redundant code block is generated based on the at least two of the K code blocks;

a unit or a means, configured to perform decoding based on a log-likelihood ratio obtained after demodulation of each to-be-decoded bit of the at least two code blocks;

a unit or a means, configured to determine that at least one code block has a decoding error;

a unit or a means, configured to determine, based on a log-likelihood ratio obtained after demodulation of each to-be-decoded bit of the code block having the decoding error and the log-likelihood ratio obtained after demodulation of the redundant code block, an a priori log-likelihood ratio of each to-be-decoded bit of the code block having the decoding error;

a unit or a means, configured to determine a combined log-likelihood ratio corresponding to each to-be-decoded bit of the code block having the decoding error, where the combined log-likelihood ratio is obtained by adding the a priori log-likelihood ratio of each to-be-decoded bit of the code block having the decoding error and a log-likelihood ratio obtained after demodulation of the bit; and a unit or a means, configured to obtain, based on the combined log-likelihood ratio of each to-be-decoded bit of the code block having the decoding error, a decoding result of the code block having the decoding error.

Optionally, the unit or the means based on the log-likelihood ratio obtained after demodulation of each to-be-decoded bit of the code block having the decoding error and the log-likelihood ratio obtained after demodulation of the redundant code block is specifically configured to: determine, based on the log-likelihood ratio obtained after demodulation of each to-be-decoded bit and the log-likelihood ratio obtained after demodulation of the redundant code block, a priori probability information about each to-be-decoded bit being decoded as 0 or 1; and determine the a priori log-likelihood ratio of each to-be-decoded bit based on the a priori probability information about each to-be-decoded bit being decoded as 0 or 1.

Optionally, the unit or the means based on the log-likelihood ratio obtained after demodulation of each to-be-decoded bit of the code block having the decoding error and the log-likelihood ratio obtained after demodulation of the redundant code block is specifically configured to determine the a priori log-likelihood ratio of each to-be-decoded bit based on the following formula:

$$LLR_{m_{ij}}^{aprior} = \log\left(\frac{Pr_{ch}^{aprior}(m_{ij} = 0)}{Pr_{ch}^{aprior}(m_{ij} = 1)}\right),$$

where $LLR_{m_{ij}}^{aprior}$ is an a priori log-likelihood ratio of a $j^{th}$ bit of an $i^{th}$ code block of the K code blocks, $m_{ij}$ is the $j^{th}$ bit of the $i^{th}$ code block of the K code blocks, $Pr_{ch}^{aprior}(m_{ij}=0)$ is a priori probability information about the $j^{th}$ bit of the $i^{th}$ code block of the K code blocks being 0, $Pr_{ch}^{aprior}(m_{ij}=1)$ is a priori probability information about the $j^{th}$ bit of the $i^{th}$ code block of the K code blocks being 1, i is a positive integer less than or equal to K, and j is an integer greater than or equal to 0.

Optionally, the unit or the means configured to determine that the at least one code block has the decoding error is specifically configured to determine, by the receiving apparatus based on a cyclic redundancy check code, that the at least one code block has the decoding error.

Optionally, the information transport block includes C groups of code blocks, each group includes at least two code blocks, and lengths of the code blocks in the group are equal. The total number of code blocks in the C groups of code blocks is K, the at least two of the K code blocks are at least two code blocks in one of the C groups of code blocks, and C is a positive integer greater than or equal to 2.

Optionally, the receiving apparatus combines the C groups of decoded code blocks based on a code block grouping sequence, to obtain the information transport block sent by the sending apparatus.

Optionally, the sending apparatus further includes: a unit or a means configured to de-concatenate the at least two code blocks and the redundant code block sent by the sending apparatus.

Optionally, the sending apparatus is a terminal device or a satellite base station.

Other methods may be obtained based on steps and procedures or a combination of some of the steps and procedures in content provided in the embodiments of this application. Based on these obtained methods and steps, a corresponding apparatus is provided, including units, modules, means, or a combination thereof that are separately configured to perform the methods and the steps.

Figure 10:
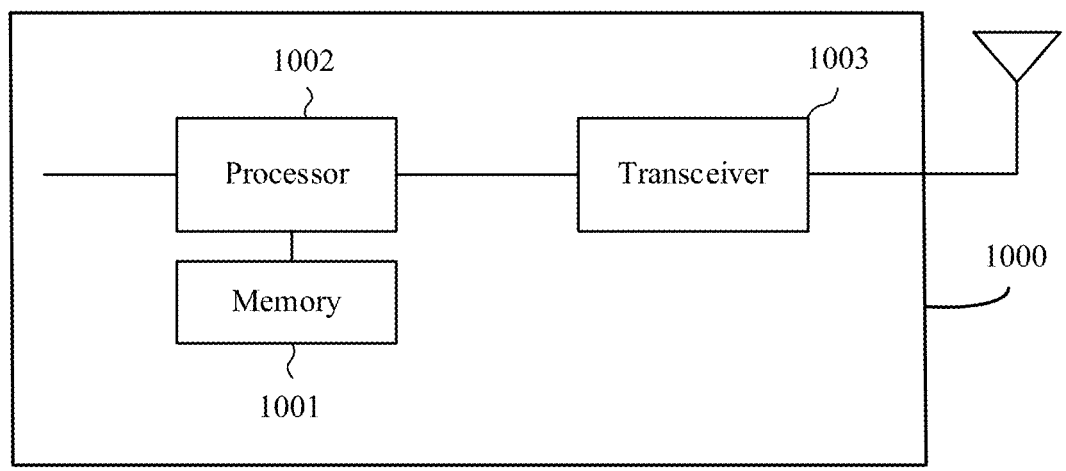
FIG. 10 is a schematic structural diagram of a sending apparatus 1000 according to this application.

FIG. 10 is a schematic structural diagram of a sending apparatus 1000 according to this application. The sending apparatus 1000 includes:

a memory 1001, configured to store a computer program instruction; and a processor 1002, configured to execute the program stored in the memory, where when the program is executed, the processor executes the computer program instruction stored in the memory, so that the sending apparatus implements the data transmission method for satellite communication related to the sending apparatus in any one of the foregoing embodiments.

Optionally, the sending apparatus 1000 further includes a transceiver 1003. When the program is executed, the processor executes the computer program instruction stored in the memory, so that the transceiver of the sending apparatus implements receiving and sending steps in the satellite communication method related to the sending apparatus in any one of the foregoing embodiments.

Figure 11:
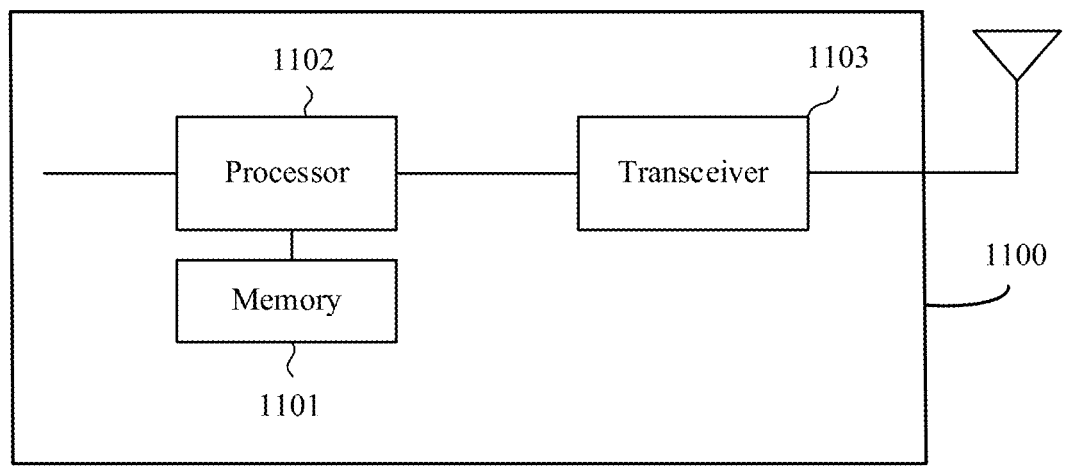
FIG. 11 is a schematic structural diagram of a receiving apparatus 1100 according to this application.

FIG. 11 is a schematic structural diagram of a receiving apparatus 1100 according to this application. The receiving apparatus 1100 includes:

a memory 1101, configured to store a computer program instruction; and a processor 1102, configured to execute the program stored in the memory, where when the program is executed, the processor executes the computer program instruction stored in the memory, so that the receiving apparatus implements the data transmission method for satellite communication related to the receiving apparatus in any one of the foregoing embodiments.

Optionally, the receiving apparatus 1100 further includes a transceiver 1103. When the program is executed, the processor executes the computer program instruction stored in the memory, so that the transceiver of the receiving apparatus implements receiving and sending steps in the satellite communication method related to the receiving apparatus in any one of the foregoing embodiments.

Figure 12:
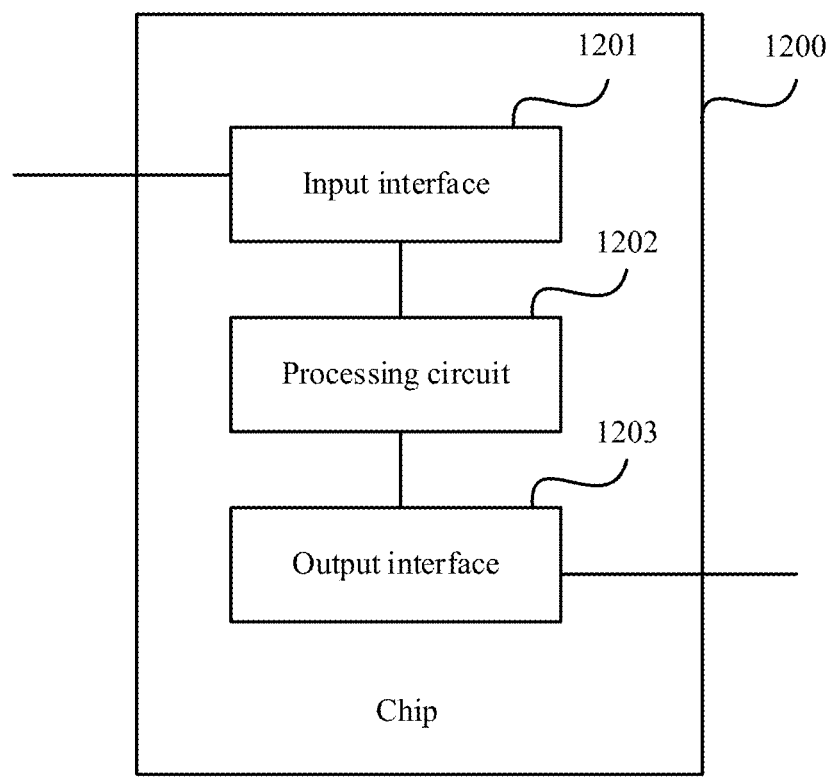
FIG. 12 is a schematic structural diagram of a chip 1200 according to this application.

FIG. 12 is a schematic structural diagram of a chip 1200 according to this application. The chip 1200 includes:

an input interface 1201, configured to obtain an information transport block, where the information transport block includes K code blocks, and K is a positive integer greater than or equal to 2;

a processing circuit 1202, configured to: generate a redundant code block based on at least two of the K code blocks, and separately perform channel coding on the at least two code blocks and the redundant code block, where lengths of the at least two code blocks are equal; and an output interface 1203, configured to output the at least two code blocks and the redundant code block on which channel coding has been performed, where the at least two code blocks and the redundant code block on which channel coding has been performed are applicable to transmission on a satellite channel.

Optionally, the processing circuit 1202 is specifically configured to generate, by the sending apparatus, the redundant code block based on the at least two of the K code blocks in a redundant code block generation manner.

Optionally, the redundant code block generation manner is an exclusive OR operation, a $j^{th}$ bit of the redundant code block is obtained by performing the exclusive OR operation on a $j^{th}$ bit of each of the at least two code blocks, j is an integer greater than 0 and less than or equal to L, and L is a length of each of the at least two code blocks.

Optionally, the information transport block includes C groups of code blocks, each group includes at least two code blocks, lengths of the code blocks in the group are equal, the total number of code blocks in the C groups of code blocks is N, and C is a positive integer greater than or equal to 2.

Optionally, lengths of the K code blocks are all equal, and K is a positive integer.

Optionally, the information transport block includes C groups of code blocks, each group includes at least two code blocks, and lengths of the code blocks in the group are equal. The total number of code blocks in the C groups of code blocks is K, C is a positive integer greater than or equal to 2, the at least two of the K code blocks are at least two code blocks in one of the C groups of code blocks, and C is a positive integer greater than or equal to 2.

Optionally, the processing circuit 1202 is further configured to concatenate the at least two code blocks and the redundant code block on which channel coding has been performed, to obtain concatenated code blocks; and the sending, by the sending apparatus, the at least two code blocks and the redundant code block on which channel coding has been performed includes: sending, by the sending apparatus, the concatenated code blocks.

Optionally, the sending apparatus is a terminal device or a satellite base station.

Figure 13:
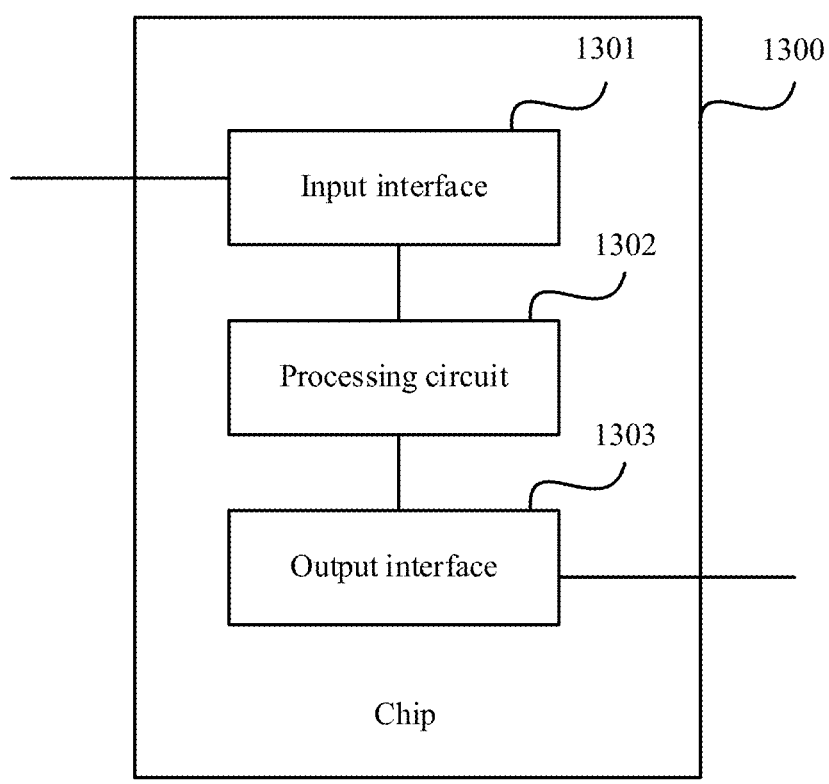
FIG. 13 is a schematic structural diagram of a chip 1300 according to this application.

FIG. 13 is a schematic structural diagram of a chip 1300 according to this application. The chip 1300 includes:

an input interface 1301, configured to obtain to-be-decoded information, where the to-be-decoded information includes log-likelihood ratios obtained after demodulation of at least two of K code blocks of an information transport block and a redundant code block, and the redundant code block is generated based on the at least two of the K code blocks;

a processing circuit 1302, configured to: determine an a priori log-likelihood ratio of each to-be-decoded bit based on a log-likelihood ratio obtained after demodulation of the to-be-decoded bit and the log-likelihood ratio obtained after demodulation of the redundant code block; determine a combined log-likelihood ratio of each to-be-decoded bit of the at least two of the K code blocks, where the combined log-likelihood ratio is obtained by adding the a priori log-likelihood ratio of each to-be-decoded bit and the log-likelihood ratio obtained after demodulation of the to-be-decoded bit; and obtain a decoding result of the at least two code blocks based on the combined log-likelihood ratio corresponding to each to-be-decoded bit of the at least two code blocks; and configured to: perform decoding based on a log-likelihood ratio obtained after demodulation of each to-be-decoded bit of the at least two code blocks; determine that at least one code block has a decoding error; configured to: determine, based on a log-likelihood ratio obtained after demodulation of each to-be-decoded bit of the code block having the decoding error and the log-likelihood ratio obtained after demodulation of the redundant code block, an a priori log-likelihood ratio of each to-be-decoded bit of the code block having the decoding error; determine a combined log-likelihood ratio corresponding to each to-be-decoded bit of the code block having the decoding error, where the combined log-likelihood ratio is obtained by adding the a priori log-likelihood ratio of each to-be-decoded bit of the code block having the decoding error and a log-likelihood ratio obtained after demodulation of the bit; and obtain, based on the combined log-likelihood ratio of each to-be-decoded bit of the code block having the decoding error, a decoding result of the code block having the decoding error; and an output interface 1303, configured to output a decoding result of the at least two code blocks or a decoding result of the code block having the decoding error.

Optionally, the processing circuit 1302 is specifically configured to: determine, based on the log-likelihood ratio obtained after demodulation of each to-be-decoded bit and the log-likelihood ratio obtained after demodulation of the redundant code block, a priori probability information about each to-be-decoded bit being decoded as 0 or 1; and determine the a priori log-likelihood ratio of each to-be-decoded bit based on the a priori probability information about each to-be-decoded bit being decoded as 0 or 1.

Optionally, the processing circuit 1302 is specifically configured to determine the a priori log-likelihood ratio of each to-be-decoded bit based on the following formula:

$$LLR_{m_{ij}}^{aprior} = \log\left(\frac{Pr_{ch}^{aprior}(m_{ij}=0)}{Pr_{ch}^{aprior}(m_{ij}=1)}\right),$$

where $LLR_{m_{ij}}^{aprior}$ is an a priori log-likelihood ratio of a $j^{th}$ bit of an $i^{th}$ code block of the K code blocks, $m_{ij}$ is the $j^{th}$ bit of the $i^{th}$ code block of the K code blocks, $Pr_{ch}^{aprior}(m_{ij}=0)$ is a priori probability information about the $j^{th}$ bit of the $i^{th}$ code block of the K code blocks being 0, $Pr_{ch}^{aprior}(m_{ij}=1)$ is a priori probability information about the $j^{th}$ bit of the $i^{th}$ code block of the K code blocks being 1, i is a positive integer less than or equal to K, and j is an integer greater than or equal to 0.

Optionally, the information transport block includes C groups of code blocks, each group includes at least two code blocks, and lengths of the code blocks in the group are equal. The total number of code blocks in the C groups of code blocks is K, the at least two of the K code blocks are at least two code blocks in one of the C groups of code blocks, and C is a positive integer greater than or equal to 2.

Optionally, the receiving apparatus combines the C groups of decoded code blocks based on a code block grouping sequence, to obtain the information transport block sent by the sending apparatus.

Optionally, the processing circuit 1302 is further configured to de-concatenate the at least two code blocks and the redundant code block sent by the sending apparatus.

Optionally, the processing circuit 1302 is specifically configured to determine, by the receiving apparatus based on a cyclic redundancy check code, that the at least one code block has the decoding error.

Optionally, the sending apparatus is a terminal device or a satellite base station.

An embodiment of this application further provides a computer-readable storage medium, transitory or non-transitory, where the computer-readable storage medium stores a computer program instruction, and when the computer program instruction is executed by a computer, the method in any one of the foregoing embodiments is implemented.

An embodiment of this application further provides a computer program product, where when the computer program product is executed by a computer, the method in any one of the foregoing embodiments is implemented.

An embodiment of this application further provides a system chip, where the system chip includes: a processing unit and a communications unit. The processing unit may be, for example, a processor, and the communications unit may be, for example, an input/output interface, a pin, or a circuit, the processing unit can execute a computer instruction to enable a chip in the communications apparatus to perform any one of the methods provided in the embodiments of this application.

One or more of the foregoing modules or units may be implemented by using software, hardware, or a combination thereof. When any one of the foregoing modules or units is implemented by using software, the software exists in a form of a computer program instruction and is stored in a memory. The processor may be configured to execute the program instruction to implement the foregoing method procedures. The processor may include, but is not limited to, at least one of the following various types of computing devices that run software: a central processing unit (CPU), a microprocessor, a digital signal processor (DSP), a microcontroller unit (MCU), an artificial intelligence processor, or the like. Each computing device may include one or more cores configured to perform calculation or processing by executing a software instruction. The processor may be embedded in a SoC (system on chip) or an application-specific integrated circuit (ASIC), or may be an independent semiconductor chip. In addition to the core configured to perform calculation or processing by executing a software instruction, the processor may further include a necessary hardware accelerator, for example, a field programmable gate array (FPGA), a PLD (programmable logic device), or a logic circuit that implements a dedicated logic operation.

When the foregoing modules or units are implemented by hardware, the hardware may be any one or any combination of a CPU, a microprocessor, a DSP, an MCU, an artificial intelligence processor, an ASIC, a SoC, an FPGA, a PLD, a dedicated digital circuit, a hardware accelerator, or a non-integrated discrete device, and the hardware may perform the foregoing method procedures by running necessary software or without depending on software.

Although this application is described with reference to specific features and the embodiments thereof, it is clear that various modifications and combinations may be made to them without departing from the spirit and scope of this application. Correspondingly, the specification and accompanying drawings are merely example description of this application defined by the appended claims, and is considered as any of or all modifications, variations, combinations or equivalents that cover the scope of this application. A person skilled in the art can make various modifications and variations to this application without departing from the spirit and scope of this application. This application is intended to cover these modifications and variations of this application provided that they fall within the scope of protection defined by the following claims and their equivalent technologies.

What is claimed is:

1. A satellite communication method, wherein the method comprises:
    obtaining, by a sending apparatus, an information transport block, wherein the information transport block comprises K code blocks, and K is a positive integer greater than or equal to 2 and wherein the information transport block comprises C groups of code blocks, each group comprises at least two code blocks, and lengths of each of the code blocks in the group are equal to each other, a total quantity of code blocks in the C groups of code blocks is K, C is a positive integer greater than or equal to 2, the at least two of the K code blocks are at least two code blocks in one of the C groups of code blocks, and C is a positive integer greater than or equal to 2;
    generating a redundant code block based on at least two of the K code blocks, wherein lengths of each of the at least two code blocks are equal to each other;
    separately performing channel coding on the at least two code blocks and the redundant code block; and
    sending, by the sending apparatus over a satellite channel, the at least two code blocks and the redundant code block on which channel coding has been performed.

2. The method according to claim 1, wherein the generating of a redundant code block based on at least two of the K code blocks comprises:
    generating the redundant code block based on the at least two of the K code blocks in a redundant code block generation manner.

3. The method according to claim 2, wherein the redundant code block generation manner is an exclusive OR operation, a $j^{th}$ bit of the redundant code block is obtained by performing the exclusive OR operation on a $j^{th}$ bit of each of the at least two code blocks, j is an integer greater than 0 and less than or equal to L, and L is a length of each of the at least two code blocks.

4. The method according to claim 3, wherein lengths of each of the K code blocks are equal to each other.

5. The method according to claim 1, wherein the method further comprises:
    concatenating, by the sending apparatus, the at least two code blocks and the redundant code block on which channel coding has been performed, to obtain concatenated code blocks; and
    the sending, by the sending apparatus, the at least two code blocks and the redundant code block on which channel coding has been performed comprises: sending, by the sending apparatus, the concatenated code blocks.

6. A sending apparatus, comprising a processor and a non-transitory memory, wherein the processor is connected to the non-transitory memory;
    the non-transitory memory is configured to store a computer program instruction, and the processor executes the computer program instruction stored in the non-transitory memory, to enable the sending apparatus to implement the satellite communication method according to claim 1.

7. A satellite communication method, wherein the method comprises:
    obtaining, by a sending apparatus, an information transport block, wherein the information transport block comprises K code blocks, and K is a positive integer greater than or equal to 2;
    generating a redundant code block based on at least two of the K code blocks, wherein lengths of each of the at least two code blocks are equal to each other;
    separately performing channel coding on the at least two code blocks and the redundant code block; and
    sending, by the sending apparatus over a satellite channel, the at least two code blocks and the redundant code block on which channel coding has been performed;
    obtaining, by a receiving apparatus, to-be-decoded information through the satellite channel, wherein the to-be-decoded information comprises log-likelihood ratios obtained after demodulation of the at least two of K code blocks;
    determining an a priori log-likelihood ratio of each to-be-decoded bit of the at least two code blocks based on a log-likelihood ratio obtained after demodulation of the to-be-decoded bit and the log-likelihood ratio obtained after demodulation of the redundant code block;
    determining a combined log-likelihood ratio of each to-be-decoded bit of the at least two of the K code blocks, wherein the combined log-likelihood ratio is obtained by adding the a priori log-likelihood ratio of each to-be-decoded bit and the log-likelihood ratio obtained after demodulation of the to-be-decoded bit; and
    obtaining, by the receiving apparatus, a decoding result of the at least two code blocks based on the combined log-likelihood ratio corresponding to each to-be-decoded bit of the at least two code blocks.

* * * * *